US008593043B2

(12) United States Patent
Igaki et al.

(10) Patent No.: US 8,593,043 B2
(45) Date of Patent: Nov. 26, 2013

(54) LED LIGHTING APPARATUS

(75) Inventors: Masaru Igaki, Kyoto (JP); Kohei Mizuta, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/533,081

(22) Filed: Jun. 26, 2012

(65) Prior Publication Data

US 2013/0003360 A1 Jan. 3, 2013

(30) Foreign Application Priority Data

Jun. 29, 2011 (JP) .................................. 2011-144715
Jul. 5, 2011 (JP) .................................. 2011-149010
Apr. 27, 2012 (JP) .................................. 2012-102062

(51) Int. Cl.
*H01J 5/16* (2006.01)

(52) U.S. Cl.
USPC ............ 313/110; 362/147; 362/235; 362/373

(58) Field of Classification Search
USPC ........................... 362/147, 235, 373; 313/110
See application file for complete search history.

(56) References Cited

U.S. PATENT DOCUMENTS

2008/0285271 A1* 11/2008 Roberge et al. ............... 362/235

FOREIGN PATENT DOCUMENTS

JP 2008-300203 12/2008

* cited by examiner

*Primary Examiner* — Mary Ellen Bowman
(74) *Attorney, Agent, or Firm* — Hamre, Schumann, Mueller & Larson, P.C.

(57) ABSTRACT

An LED lighting apparatus includes a support unit including a support surface facing an illumination side, a plurality of LED chips supported on the support surface, and a cover that covers the support surface and transmits light from the LED chips. The cover includes a periphery which, as viewed in plan, includes four first sides that are spaced apart from each other and four second sides each connecting ends of adjacent ones of the first sides. The first sides consisting of two pairs of parallel sides, and each of the first sides constituting one of the two pairs and each of the first sides constituting the other one of the two pairs form a right angle. Each of the first sides and each of the adjacent second sides form an obtuse angle.

20 Claims, 23 Drawing Sheets

LED LIGHTING APPARATUS

BACKGROUND OF THE INVENTION

1. Field of the Invention

The present invention relates to a lighting apparatus utilizing LED chips.

2. Description of the Related Art

LED lighting apparatuses including LED chips have been developed as an alternative to a conventional lighting apparatus using e.g. a fluorescent lamp. A lighting apparatus to be attached to a ceiling is often called a ceiling light.

FIGS. 35 and 36 show an example of conventional LED lighting apparatus for use as a ceiling light (see JP-A-2008-300203, for example). The LED lighting apparatus 900 shown in the figure is used as attached to a ceiling 800. The LED lighting apparatus 900 includes a plurality of light source units 910, a reflective surface 920 and a cover 930. Each of the light source units 910 incorporates LED chips (not shown). The reflective surface 920 is a surface of a metal plate that is painted white. Light from the light source units 910 is reflected by the reflective surface 920 to travel downward, as shown in FIG. 35. The cover 930 covers the reflective surface 920 and is generally rectangular as viewed in plan. The cover 930 is made of e.g. a resin material that transmits light while diffusing, and hence, transmits the light, reflected by the reflective surface 920, downward in FIG. 35 while diffusing.

The edges of the cover 930 are rather distant from the reflective surface 920, so that light from the light source units 910 does not easily reach the edges. In particular, the amount of light reaching the four corners of the rectangle defined by the edges of the cover 930 is considerably small. Thus, when the LED lighting apparatus 900 is used, the four corners of the cover 930 may look dark.

Moreover, as shown in FIG. 35, the light source units 910 of the LED lighting apparatus 900 are arranged to emit light inward, in order that as much light from the light source units 910 as possible is reflected downward in the figure by the reflective surface 920.

According to the above-described arrangement, however, light from the light source units 910 does not easily reach the ceiling 800. Thus, the ceiling 800 to which the LED lighting apparatus 900 is attached may look dark when people in the room look up.

SUMMARY OF THE INVENTION

The present invention has been proposed under the circumstances described above. It is therefore an object of the present invention to provide an LED lighting apparatus which is provided with a cover generally rectangular in plan view and which prevents the edges of the cover from becoming relatively dark.

Another object of the present invention is to provide an LED lighting apparatus that illuminates the ceiling brightly.

An LED lighting apparatus provided according to a first aspect of the present invention comprises: a support unit including a support surface facing an illumination side in a first direction; a plurality of LED chips supported on the support surface; and a cover that covers the support surface and transmits light from the LED chips. The cover has a periphery including four first sides spaced apart from each other and four second sides, where the first sides are grouped into a first pair and a second pair, each of the pairs including two parallel sides of the first sides, the two parallel sides of the first pair extending in a direction perpendicular to another direction in which the two parallel sides of the second pair extend, and where each of the second sides connects two adjacent sides of the first sides, and each of the second sides and each of two adjacent sides form an obtuse angle.

Preferably, the cover is formed with at least one concave lens corresponding in position to one of the second sides.

Preferably, the second sides are shorter than the first sides.

Preferably, the support unit comprises: a central member including an annular portion; and a plurality of support members removably attached to an outer circumference of the annular portion, where each of the support members provides the support surface of the support unit.

Preferably, the central member includes a plurality of first fitting portions arranged at regular intervals along the outer circumference of the annular portion, and each of the support members includes a second fitting portion configured to be fitted to a respective one of the first fitting portions to be attached to the central member.

Preferably, each of the first fitting portions is a male part projecting outward in a radial direction of the annular portion, and each of the second fitting portions is a female part configured to receive a respective one of the first fitting portions.

Preferably, each of the first fitting portions is H-shaped as viewed in the radial direction of the annular portion.

Preferably, the annular portion is H-shaped in a cross section perpendicular to a circumferential direction of the annular portion.

Preferably, each of the support members includes: a hollow support bar extending in a radial direction of the annular portion; and a support plate fixed to the support bar and including a surface serving as the support surface, wherein the second fitting portion is provided at an end of the support bar.

Preferably, the support plate is positioned on the illumination side in the first direction with respect to the support bar.

Preferably, the plurality of support members as a whole defines a generally rectangular contour.

Preferably, the support members are made up of four members having a same shape.

Preferably, each of the support members has a periphery including a first edge, a pair of second edges and a pair of third edges, the second edges being connected to ends of the first edge respectively, the third edges being connected to the second edges respectively, the first edge facing one of the first sides of the cover, each of the second edges facing one of the second sides of the cover, each of the third edges facing one of the third edges of adjacent support member.

Preferably, the LED lighting apparatus further comprises a moisture absorber including a moisture absorbent.

Preferably, the LED lighting apparatus further comprises a moisture absorber including a moisture absorbent, where the moisture absorber overlaps the central member as viewed in the first direction.

Preferably, the moisture absorber includes an indicator for indicating whether moisture content of the moisture absorbent has exceeded a predetermined level.

Preferably, the indicator comprises a material that changes color by absorbing moisture.

Preferably, the moisture absorber includes a window for allowing the indicator to be seen from outside.

Preferably, the moisture absorber is provided on an inner side of the cover.

Preferably, the LED lighting apparatus further comprises a power source unit for supplying power for the LED chips, where the power source unit is provided on a side of the support surface opposite to the illumination side.

An LED lighting apparatus provided according to a second aspect of the present invention comprises: a light source unit including at least one LED chip; a support portion supporting the light source unit; a light-transmitting cover at least part of which is on an illumination side, which is one side in a first direction, of the support portion, the cover being configured to transmit light from the light source unit; and a diffusion reflection plate arranged on an installation side, which is the other side in the first direction, of the support portion, the plate being configured to reflect light from the light source unit. The support portion includes a plurality of side surfaces partitioning between the outer side, which is one side in a second direction perpendicular to the first direction, and the inner side, which is the other side in the second direction. The inner side in the second direction is surrounded by the plurality of side surfaces, and the light source unit is arranged on the outer side in the second direction of a first side surface that is one of the plurality of side surfaces.

Preferably, the first side surface is perpendicular to the second direction.

Preferably, the light source unit comprises a substrate including a placing surface and a bottom surface facing opposite directions, a protective member configured to transmit light from the LED chip and covering the LED chip, and a holder for fixing the substrate and the protective member to the first side surface. The LED chip is placed on the placing surface side of the substrate.

Preferably, the protective member includes a lens surface overlapping the LED chip as viewed in the second direction.

Preferably, the protective member includes a pair of tapered surfaces arranged to sandwich the lens surface in the first direction. Each of the tapered surfaces is inclined to be away from the LED chip in the second direction as proceeding away from lens surface in the first direction.

Preferably, the holder includes a bottom plate sandwiched between the bottom surface and the first side surface in the second direction, and a pair of side plates standing from the bottom plate in the second direction. The protective member is positioned between the paired side plates in the first direction.

Preferably, the holder further includes a pair of support plates positioned between the paired side plates in the first direction, and the paired support plates sandwich and support the protective member in the first direction.

Preferably, the protective member comprises a pair of side surfaces spaced apart from each other in the first direction, a first engagement portion projecting from one of the side surfaces that is on the installation side in the first direction toward the installation side in the first direction, and a second engagement portion projecting from the other one of the side surfaces that is on the illumination side in the first direction toward the illumination side in the first direction. One of the paired support plates that is on the installation side in the first direction is in contact with the first engagement portion, whereas the other one of the support plates that is on the illumination side in the first direction is in contact with the second engagement portion.

Preferably, one of the paired support plates that is on the installation side in the first direction includes a mirror surface facing the illumination side in the first direction, whereas the other one of the support plates that is on the illumination side in the first direction includes a mirror surface facing the installation side in the first direction.

Preferably, the substrate includes a through-hole penetrating in the second direction, and the protective member includes a projection fitted in the through-hole.

Preferably, the substrate includes a through-hole penetrating in the second direction. The first side surface includes an opening overlapping the through-hole as viewed in the second direction. The protective member includes a bottom surface that is in contact with the placing surface. The holder projects from the bottom surface of the protective member in the second direction to reach the opening through the through-hole.

Preferably, the diffusion reflection plate includes an inclined portion gradually displaced toward the illumination side in the first direction as proceeding away from the light source unit in the second direction. The inclined portion overlaps the light source unit as viewed in the second direction.

Preferably, the light-transmitting cover includes an illumination-side covering portion, and an installation-side covering portion positioned on the installation side in the first direction with respect to the illumination-side covering portion.

Preferably, the installation-side covering portion is on the installation side in the first direction with respect to the diffusion reflection plate.

Preferably, the end of the diffusion reflection plate on the one side in the second direction is positioned on the other side in the second direction with respect to the end of the installation-side covering portion on the one side in the second direction.

Preferably, the diffusion reflection plate includes a window penetrating in the first direction.

Preferably, the LED lighting apparatus further includes a light guide arranged on the installation side in the first direction with respect to the diffusion reflection plate. The light guide includes an incident portion facing the illumination side of the diffusion reflection plate in the first direction through the window, and an emission surface facing the installation side.

Preferably, the emission surface includes a smooth portion, and a rough portion formed with irregularities.

Preferably, the smooth portion is smaller than the rough portion in width in the second direction.

Preferably, the LED lighting apparatus further comprises a reflective member including a reflective surface facing the installation side, and arranged on the illumination side of the light guide in the first direction.

Preferably, the LED lighting apparatus further comprises an additional light guide arranged on the illumination side of the reflective member in the first direction and including an additional emission surface facing the illumination side.

Preferably, the LED lighting apparatus further comprises a reflective part covering an edge of the light guide on the one side in the second direction.

Preferably, the first side surface is inclined with respect to a surface perpendicular to the second direction and gradually displaced toward the one side in the second direction as proceeding toward the installation side in the first direction.

Preferably, the light source unit includes a substrate including a placing surface and a bottom surface facing opposite directions. The bottom surface is in contact with the first side surface. The LED chip is placed on the placing surface side of the substrate.

According to the above-described arrangements, the light from the light source units is emitted toward the one side in the second direction which is opposite from the inner side of the support unit or portion. In the conventional LED lighting apparatus, light from the light source units is emitted inward in the radial direction, so that only a small amount of light is emitted toward the ceiling. The structure according to the present invention solves such a problem. That is, the LED lighting apparatus according to the present invention has a structure that guides more light from the light source units toward the installation side than in the conventional structure, and hence, illuminates the ceiling brightly.

Other features and advantages of the present invention will become more apparent from detailed description given below with reference to the accompanying drawings.

DETAILED DESCRIPTION OF THE PREFERRED EMBODIMENTS

Figure 1:
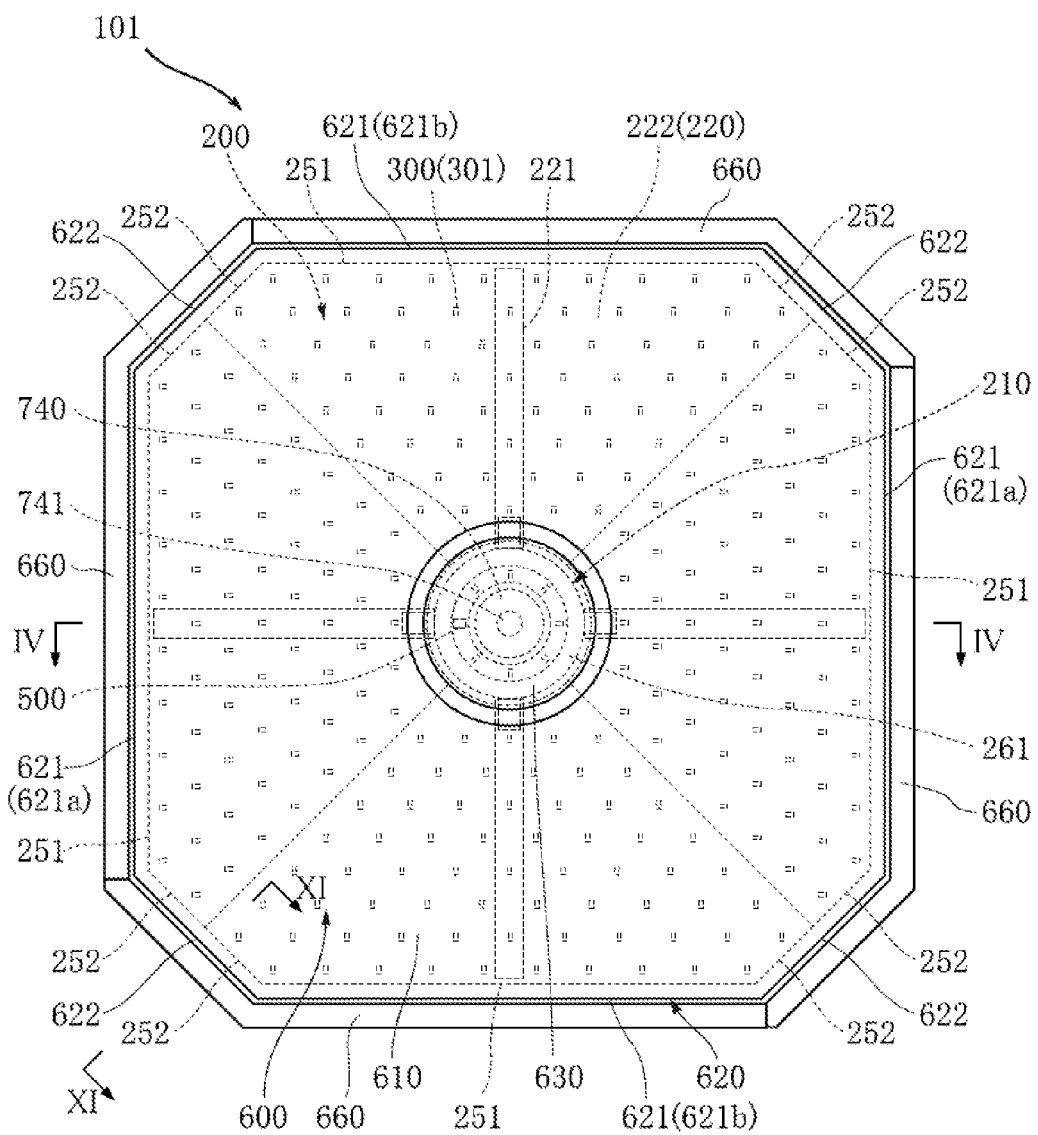
FIG. 1 is a plan view showing an LED lighting apparatus according to a first embodiment of the present invention.
Figure 2:
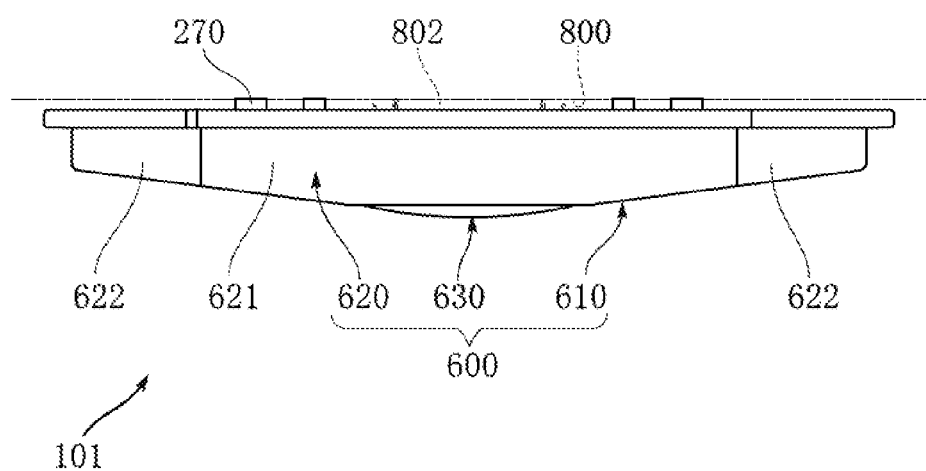
FIG. 2 is a side view showing the LED lighting apparatus of FIG. 1.

Preferred embodiments of the present invention are described below with reference to the accompanying drawings.

FIGS. 1-4 illustrate an LED lighting apparatus according to a first embodiment of the present invention. The LED lighting apparatus 101 of this embodiment includes a support unit 200, a plurality of LED modules 300, a power source unit 400, a receiver 500, a cover 600, and a moisture absorber or hygroscopic unit 740. The LED lighting apparatus 101 is configured to be attached to e.g. a power supply portion 801 in a ceiling 800 via an attachment 802 for use as a ceiling light.

Figure 3:
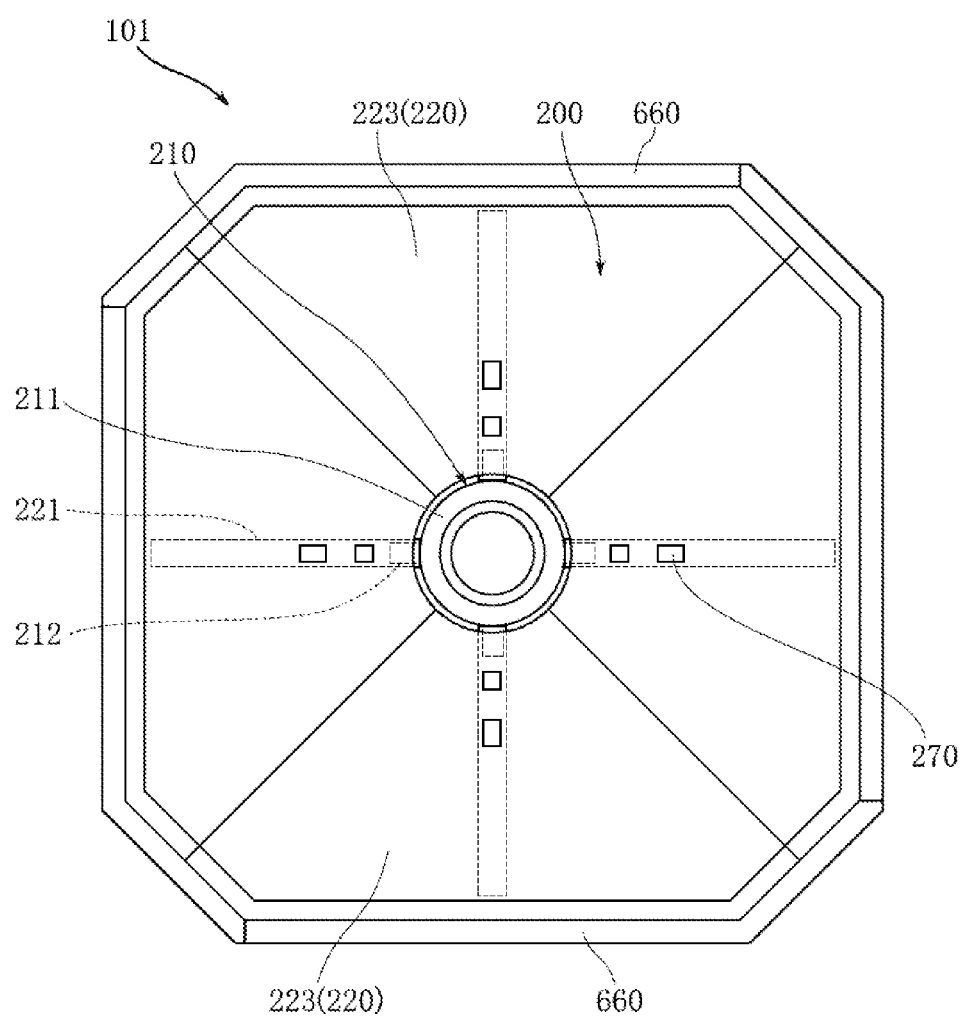
FIG. 3 is a bottom view showing the LED lighting apparatus of FIG. 1.
Figure 4:
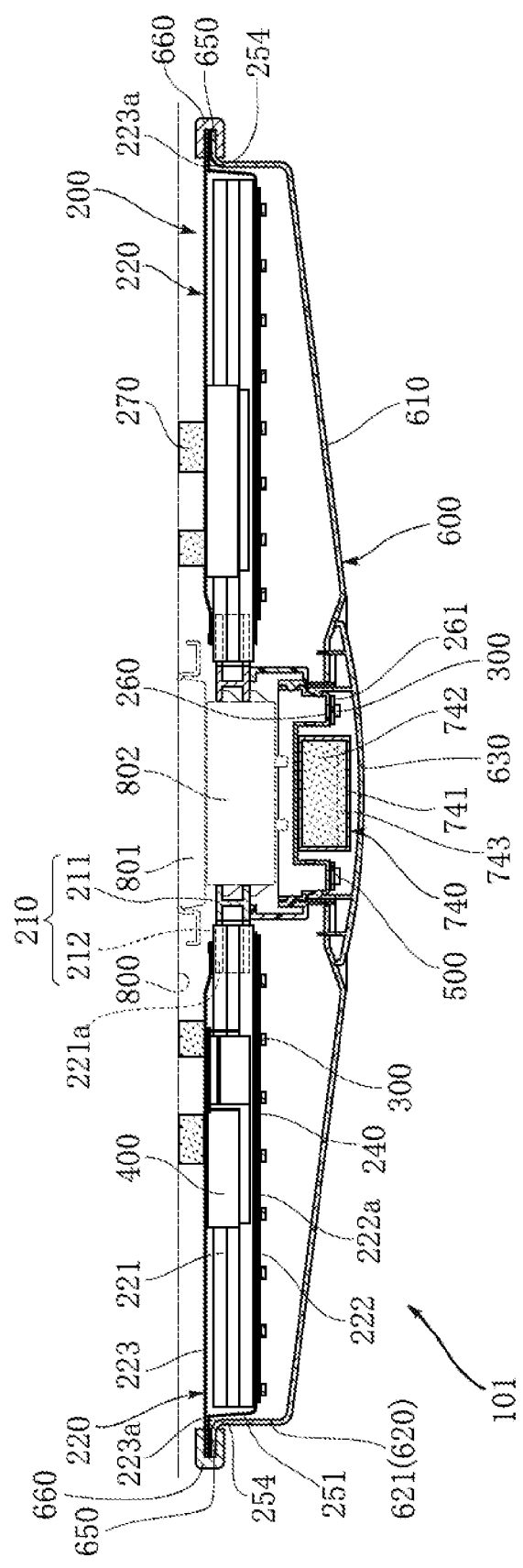
FIG. 4 is a sectional view taken along lines IV-IV in FIG. 1.
Figure 5:
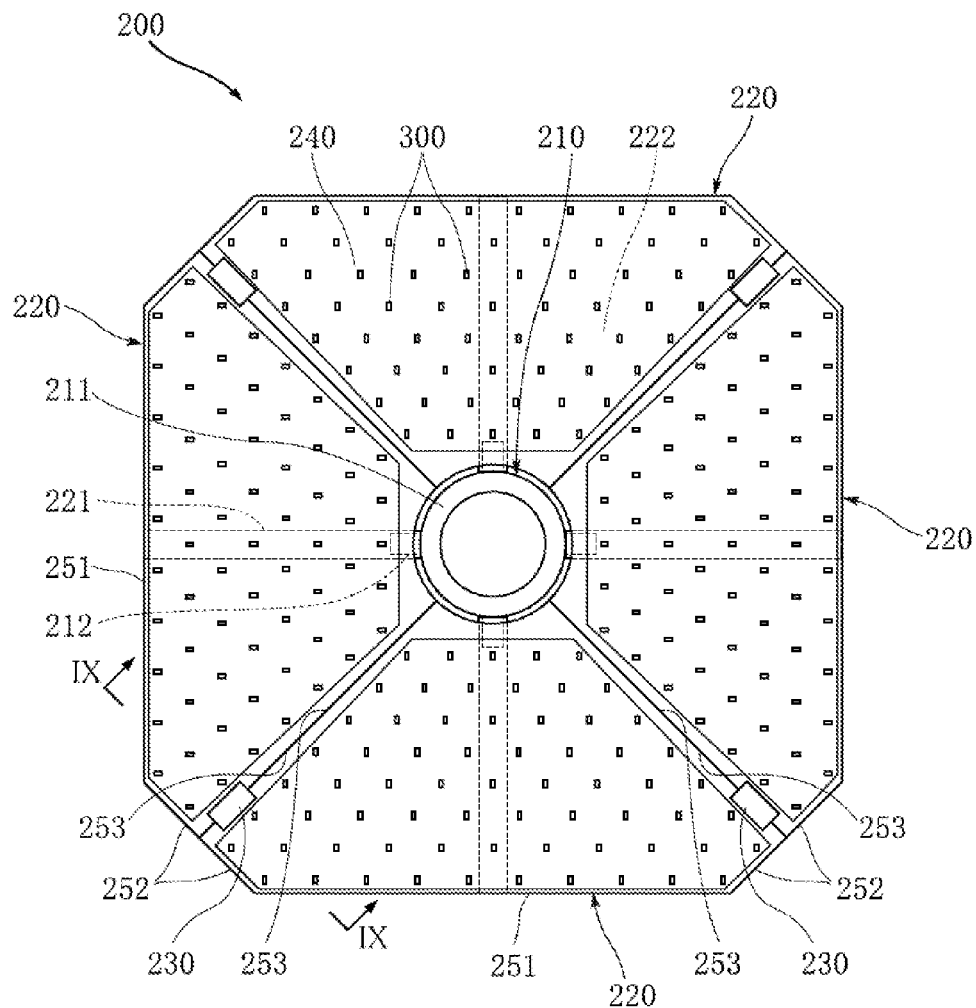
FIG. 5 is a plan view showing a support unit.

The support unit 200 constitutes the support structure of the LED lighting apparatus 101, and includes a central member 210 and a plurality of support members 220, as shown in FIGS. 3-5. The central member 210 is made of e.g. metal and includes an annular portion 211 that is annular in plan view and a plurality of first fitting portions 212 arranged at regular intervals along the circumference of the annular portion 211. The first fitting portions 212 are male parts projecting radially outward from the annular portion 211. In this embodiment, four first fitting portions 212 are arranged along the circumference of the annular portion 211. The four first fitting portions 212 are 90° apart from each other in the circumferential direction of the annular portion 211.

Figure 6:
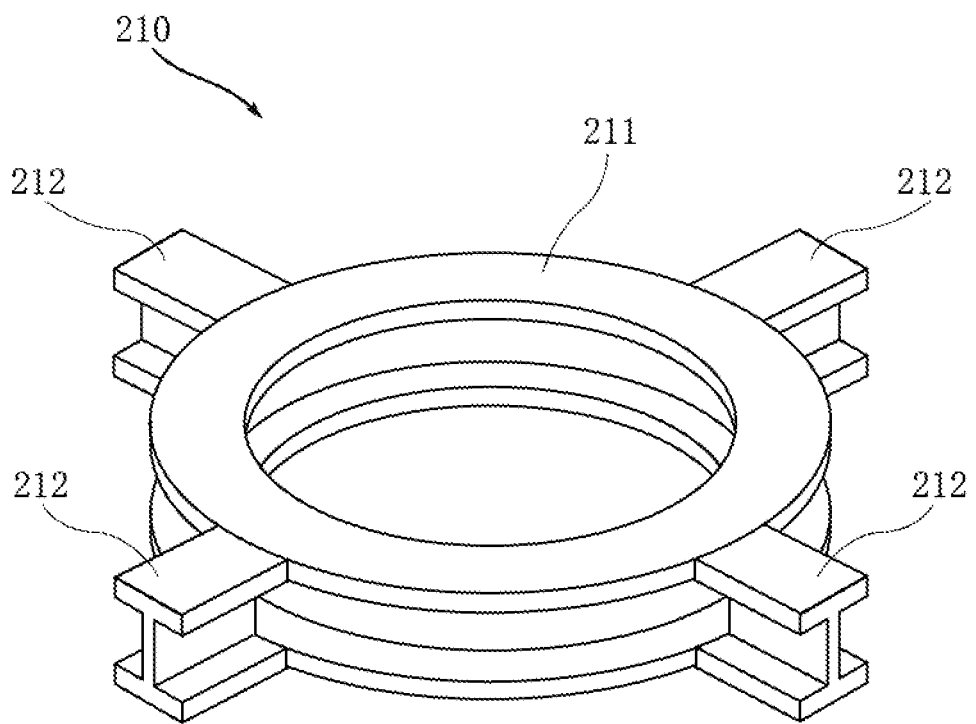
FIG. 6 is a perspective view showing a central member.
Figure 7:
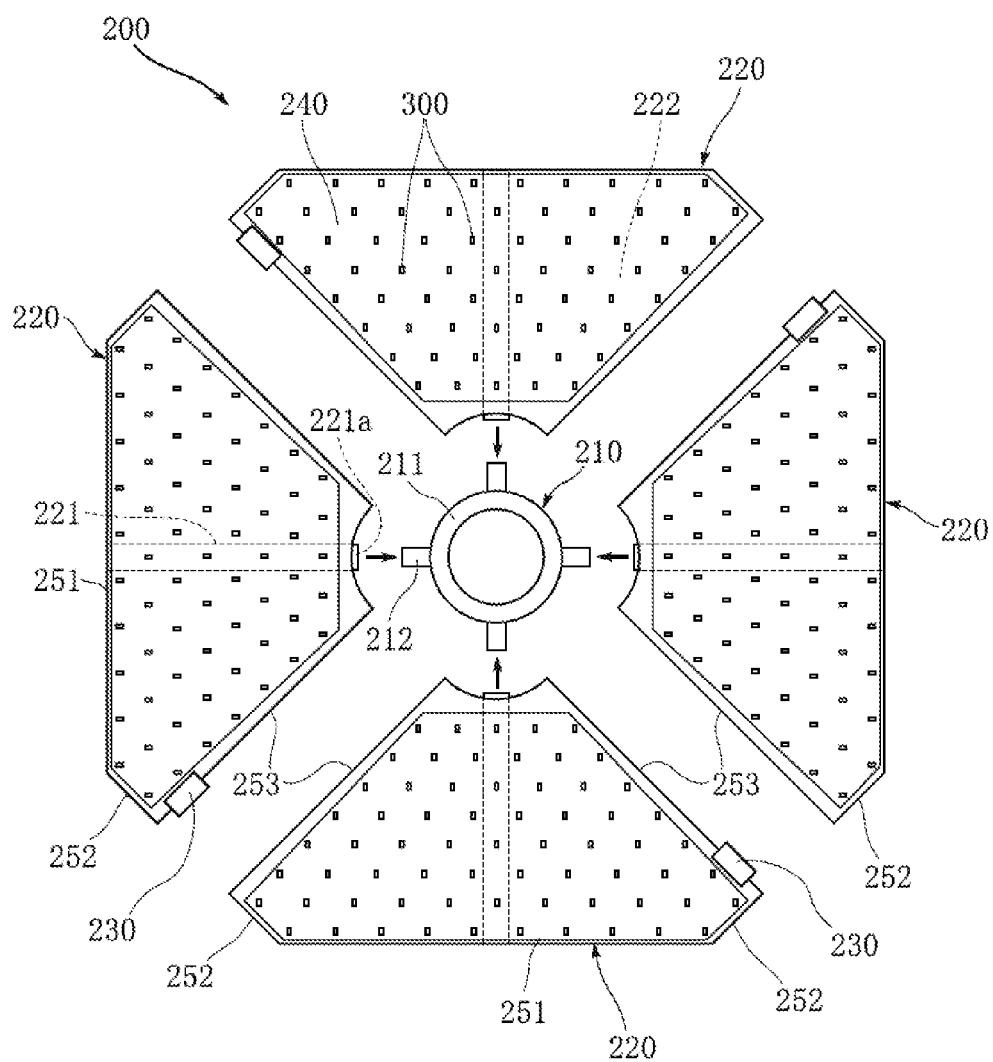
FIG. 7 is a plan view showing the state in which the central member and support members are separated.

As shown in FIGS. 4 and 6, the annular portion 211 is H-shaped in cross section perpendicular to the circumferential direction of the annular portion 211. As shown in FIG. 6, each of the first fitting portions 212 is also H-shaped as viewed in the radial direction of the annular portion 211. The first fitting portions 212 are fixed to the annular portion 211 by an appropriate means such as welding.

Figure 8:
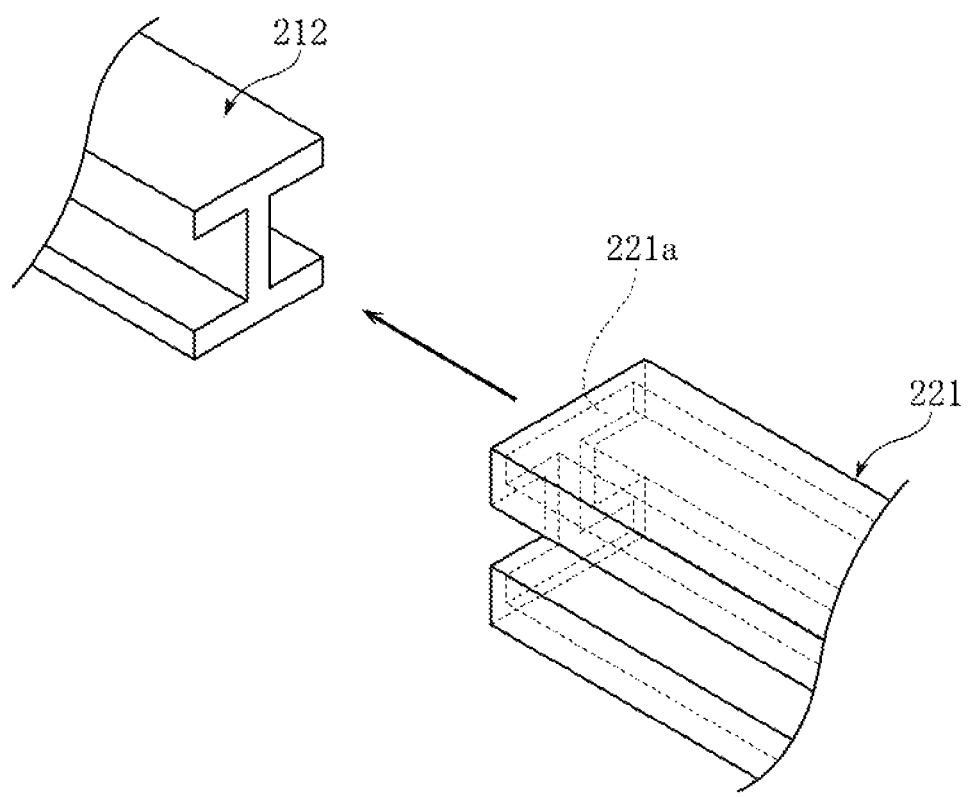
FIG. 8 is a perspective view for describing the fitting of a first fitting portion and a second fitting portion.

As shown in FIGS. 3-5 and 7, the support members 220 are arranged at a constant pitch around the central member 210. In this embodiment, four support members 220 are attached to the central member 210. Each of the support members 220 includes a support bar 221, a support plate 222 and a backup plate 223. The support bar 221 is a hollow bar extending in the radial direction of the annular portion 211 and having an H-shaped cross section. The support bar 221 is made of a metal material having high heat dissipation ability, such as aluminum. As will be understood from FIG. 8, the inner space of the support bar 221 has an H-shaped cross section corresponding to the first fitting portion 212 of the central member 210. The inner space of the support bar 221 is open to the outside at an end of the support bar 221. This end of the support bar 221 serves as a second fitting portion 221a as a female part, into which the first fitting portion 212 of the central member 210 can be fitted with almost no clearance. By fitting the second fitting portion 221a around the first fitting portion 212, each support member 220 is removably attached to the central member 210. The first and the second fitting portions 212, 221a are provided with a lock mechanism (not shown) that prevents unintentional detachment of the fitting portions 212 and 221a, by using e.g. a screw. The central member 210 and each support member 220 are electrically connected to each other via a power supply connector (not shown).

The support plate 222 is e.g. a metal plate and supports the LED modules 300. As shown in FIG. 4, the support plate 222 is on the lower side in the figure, i.e., on the opposite side of the ceiling 800 with respect to the support bar 221 (on the "illumination side in the first direction" defined in the present invention). The support plate 222 is fixed to the support bar 221 e.g. by welding or with a screw. The support plate 222 has a support surface 222a facing downward. As shown in FIG. 5, the support plate 222 is generally triangular as viewed in plan and has a same size on each side with respect to the longitudinal direction of the support bar 221.

The backup plate 223 is e.g. a metal plate and provided on the upper side with respect to the support bar 221, as shown in FIG. 4. The backup plate 223 is fixed to the support bar 221 e.g. by welding or with a screw. A plurality of shock absorbers 270 are provided on a surface of the backup plate 223 on the ceiling 800 side.

Figure 9:
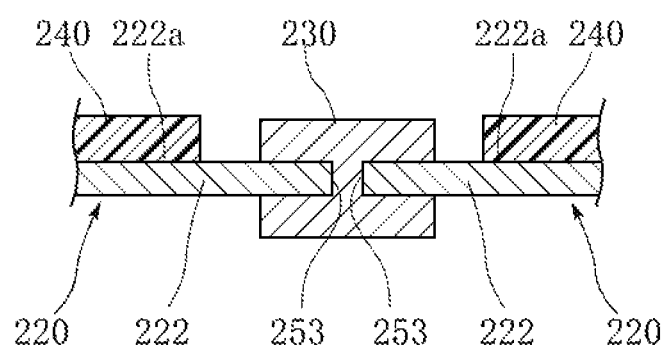
FIG. 9 is a schematic sectional view taken along lines IX-IX in FIG. 5.

As shown in FIG. 5, the four support members 220 have the same shape as viewed in plan. In the state where the four support members 220 are attached to the central member 210, the contour of the support members 220 as a whole has a generally rectangular shape. The periphery of each support member 220 (support plate 222) includes a first edge 251, a pair of second edges 252 and a pair of third edges 253. The first edge 251 extends perpendicularly to a radial direction of the annular portion 211. The second edges 252 are connected to two ends of the first edge 251, respectively. The first and the second edges 251, 252 are at positions corresponding to the periphery 620 of the cover 600, which will be described later in detail. The third edges 253 are connected to the second edges 252, respectively, and face the third edges of the adjacent support members 220. In this embodiment, as shown in FIGS. 5 and 9, third edges 253 of adjacent support members 220 are detachably connected to each other by a connection member 230. In this embodiment, as shown in FIG. 4, the end of each support plate 222 is bent to form a flange portion 254 connected to the first and the second edges 251, 252 and overlapping the end 223a of the backup plate 223.

The LED modules 300 are supported on the support surface 222a of the support plate 222 via an LED substrate 240. The LED substrate 240 is an insulating substrate made of e.g. glass-fiber-reinforced epoxy resin. The LED modules 300 are mounted on the LED substrate 240.

Figure 10:
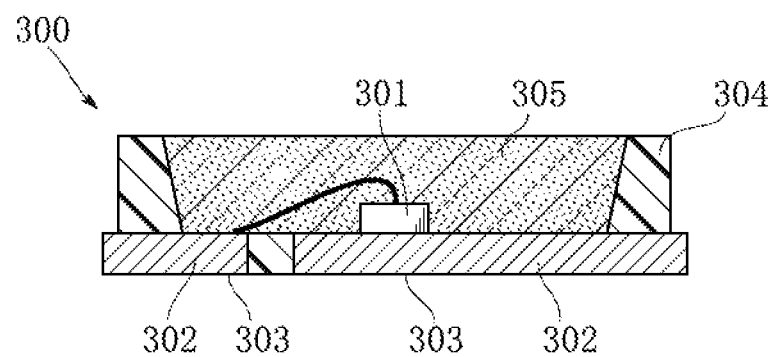
FIG. 10 is a sectional view showing an example of LED module used for the LED lighting apparatus of FIG. 1.

Each of the LED modules 300 is in the form of an elongated rectangle as viewed in plan. FIG. 10 is a sectional view of the LED module 300 in a plane perpendicular to the width direction. As shown in the figure, the LED module 300 includes a pair of leads 302, an LED chip 301, a sealing resin 305 and a case 304. The paired leads 302 are made of e.g. Cu alloy. The LED chip 301 is mounted on one of the leads 302. The surfaces of the leads 302 opposite from the surface on which the LED chip 301 is mounted serve as mounting terminals 303 for surface-mounting the LED module 300. The LED chip 301 is the light source of the LED module 300 and is configured to emit e.g. blue light. The sealing resin 305 protects the LED chip 301. The sealing resin 305 is made of a light-transmitting resin material containing a fluorescent substance that emits yellow light when excited by light from the LED chip 301. According to this structure, the LED module 300 can be configured to emit light of a desired color temperature. Instead of the fluorescent substance that emits yellow light, mixture of a fluorescent substance that emits red light and a fluorescent substance that emits green light may be used. The case 304 is made of e.g. white resin and reflects the light traveling toward the sides from the LED chip 301 in the upward direction. An LED of a type that uses two wires for connection to the paired leads 302 may be employed as the LED chip 301.

In this embodiment, as viewed in plan, the LED modules 300 on each support plate 222 are arranged at a predetermined pitch in a plurality of rows that extend perpendicularly to a radial direction of the annular portion 211 and that are spaced from each other in the radial direction.

In this embodiment, as shown in FIG. 4, a support stay 260 is provided in the cover 600. The support stay 260 is arranged below the central member 210 in FIG. 4. Below the support stay 260 is provided an annular LED substrate 261. A plurality of LED modules 300 are mounted in a circle on the LED substrate 261.

All the LED modules 300 may be the LED modules configured to emit light of an incandescent color. Alternatively, all the LED modules 300 may be the LED modules configured to emit light of a daylight white color. Alternatively, the LED modules 300 may comprise a mixture of these two types of LED modules. In that case, for instance, the LED modules 300 that emit light of an incandescent color and the LED modules 300 that emit light of a daylight white color are alternately arranged.

The power source unit 400 converts e.g. AC 100V power supplied through the power supply portion 801 in the ceiling 800 to DC power suitable for lighting the LED chips 301 and supplies the DC power to the LED modules 300. The power source unit 400 includes e.g. a transformer, a capacitor, a resistor, a diode and an IC. The power source unit 400 is configured to individually control the brightness of the LED modules 300 that emit light of an incandescent color and the brightness of the LED modules 300 that emit light of a daylight white color. Thus, the LED lighting apparatus 101 can emit light of different color temperatures between an incandescent color and a daylight white color, as desired. The power source unit 400 can turn on and off the LED modules 300 on the support stay 260 (LED substrate 261) independently from other LED modules 300. In this embodiment, as shown in FIG. 4, the power source unit 400 is arranged in the space between the support plate 222 and the backup plate 223 and on the upper side of the support surface 222a.

The receiver 500 receives signals from a transmission unit, not shown. In this embodiment, the receiver 500 is mounted on the LED substrate 261. The signals received by the receiver 500 are sent to the power source unit 900. Based on the signals, the power source unit 400 controls the lighting state of the LED modules 300.

The cover 600 constitutes most of the appearance of the LED lighting apparatus 101 and includes an inclined portion 610, a periphery 620 and a center portion 630. The inclined portion 610 is made of e.g. milky-white translucent resin and covers the support surfaces 222a. As shown in FIG. 4, the inclined portion 610 is inclined to become lower at a position closer to the center.

The periphery 620 is connected to the outer edge of the inclined portion 610 to surround the inclined portion 610 from outside. As shown in FIGS. 1 and 4, the periphery 620 is in the form of an outer wall standing in the plan-view direction (vertical direction in FIG. 4). As shown in FIG. 1, as viewed in plan, the periphery 620 includes two pairs of parallel sides, i.e., four first sides 621 (621a, 621b), all of which are spaced from each other. The periphery 620 further includes four second sides 622. The first sides 621*a* constituting one of the two pairs and the first sides 621*b* constituting the other pair form right angles. Each of the four second sides 622 connects ends of adjacent first sides 621 to each other. Each of the first sides 621 and the adjacent second side 622 form an obtuse angle. The second sides 622 are shorter than the first sides 621. As shown in FIG. 1, the first sides 621 face the first edges 251 of the support members 220, whereas the second sides 622 face the second edges 252 of the support members 220. In this embodiment, as shown in FIG. 4, an engagement flange portion 650 projecting outward is connected to the end of the periphery 620.

Figure 11:
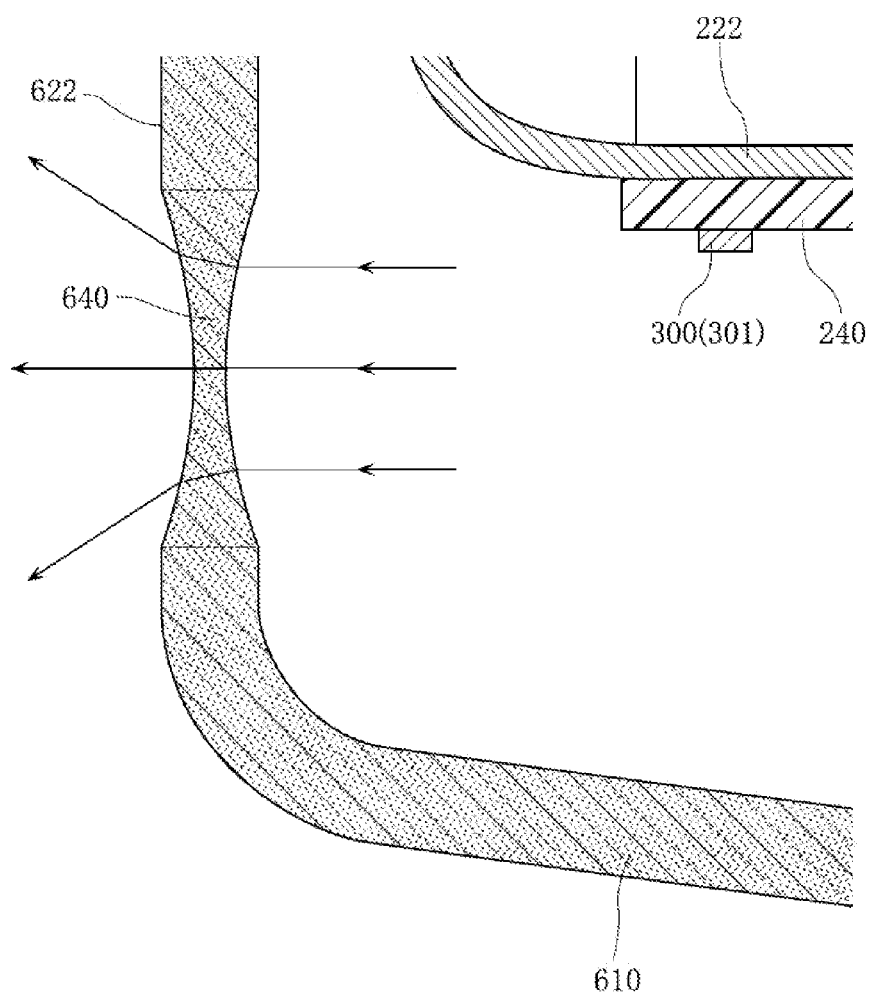
FIG. 11 is an enlarged partial sectional view taken along lines XI-XI in FIG. 1.

As shown in FIG. 11, the periphery 620 has a concave lens 640 at a portion corresponding each of the second sides 622. The concave lenses 640 refract the light from the LED modules 300 (LED chips 301) upward (toward the "installation side in the first direction" defined in the present invention).

As shown in FIG. 4, in this embodiment, the end of the periphery 620 on the ceiling 800 side is integrally connected to the engagement flange portion 650 projecting outward. The engagement flange portion 650 overlaps the ends 223*a* of the backup plates 223 and the flange portions 254 of the support plates 222. The ends 223*a*, the flange portions 254 and the engagement flange portions 650 are fastened together using clips 660. The clips 660 are made of e.g. resin or metal. Each of the clips 660 has a generally U-shaped cross section and has a shape corresponding to the first side 621 and the adjacent second side 622 of the periphery 620, as shown in FIG. 1. In this embodiment, four clips 660 are used to surround the substantially entire periphery of the support unit 200 and the cover 600. The clips 660 hold the flange portions 254 in close contact with the engagement flange portions 650 and prevent the detachment of the cover 600 from the support unit 200.

The center portion 630 is made of e.g. milky-white translucent resin and positioned on the inner side of the inclined portion 610. The center portion 630 is removably attached to the inclined portion 610 and covers the support stay 260.

As shown in FIG. 4, the moisture absorber 740 is attached to the support stay 260. Specifically, the support stay 260 includes a recess for receiving the moisture absorber 740, and the moisture absorber 740 is removably attached to the bottom surface of the recess. As shown in FIG. 1, the moisture absorber 740 overlaps the central member 210 as viewed in plan.

The moisture absorber 740 is made up of a container having vent holes (not shown) in side walls, and moisture absorbent 742 provided in the container. The moisture absorbent 742 may be silica gel. In this embodiment, as shown in FIG. 4, the moisture absorber 740 further includes an indicator 743 arranged at a lower portion of the container. The indicator 743 indicates whether the moisture content of the moisture absorbent 742 has exceeded a predetermined level. As the indicator 743, cobalt chloride impregnated silica gel may be used. In this case, the indicator 743 is blue when it is dry, and changes to pink when it is wet by absorbing moisture. The side walls of the container are formed with vent holes, and moisture around the moisture absorber 740 is first absorbed by the moisture absorbent 742. After most part of the moisture-absorbent 742 has absorbed moisture, the indicator 743 under the moisture absorbent 742 absorbs moisture.

The bottom wall of the container of the moisture absorber 740 has a window 741 at the center for showing the indicator 743. The color change of the indicator 743 can be seen from outside through the window 741 and the center portion 630 of the cover 600.

The advantages of the LED lighting apparatus 101 are described below.

According to this embodiment, as described with reference to FIG. 1, the periphery 620 of the cover 600 is defined by two pairs of parallel first sides 621, and four second sides 622 each connecting adjacent first sides 621 to each other. Each of the first sides 621 and the adjacent second side 622 form an obtuse angle, and the second sides 622 are shorter than the first sides 621. That is, as viewed in plan, the periphery 620 of the cover 600 has a shape obtained by cutting away four corners of a rectangle and connecting adjacent sides by a straight line i.e., the second side 622. With this arrangement, light from the LED chips 301 supported on the support unit 200 reaches both the first sides 621 and the second sides 622 substantially uniformly. Thus, the LED lighting apparatus 101, though having a cover 600 of a generally rectangular contour, prevents the edges of the cover 600 from partially looking dark.

As noted before, the portion of the cover 600 that corresponds to each of the second sides 622 is formed with a concave lens 640 to refract the light from the LED chips 301 to the ceiling 800 side. Thus, part of the light passing through the concave lenses 640 illuminates the ceiling adjacent to the second sides 622. With this arrangement, the area adjacent to the second sides 622 is illuminated brightly. This is favorable for preventing the periphery of the cover 600 from looking dark.

As noted before, the support unit 200 includes a central member 210 and a plurality of support members 220 removably attached to the central member 210. Thus, the LED lighting apparatus 101 before the installation can be kept compact by disassembling the support unit 200, so that handling of the lighting apparatus 101 is easy.

The support members 220 can be easily attached to the central member 210 by fitting the first fitting portions 212 provided on the outer circumference of the annular portion 211 into the second fitting portions 221*a* of the support members 220.

Each of the first fitting portions 212 is a male part that is H-shaped in cross section, whereas each of the second fitting portions 221*a* is a female part that is H-shaped in cross section and configured to receive the first fitting portion 212. These fitting portions 212, 221*a* that are H-shaped in cross section have a small section modulus, so that stress concentration on the fitting portions 212, 221*a* is prevented.

The annular portion 211 of the central member 210 supports the support members 220 arranged on the circumference and functions as the base support of the central member 210. The annular portion 211 is H-shaped in cross section perpendicular to the circumferential direction of the annular portion 211. This arrangement is favorable in terms of mechanical strength of the annular portion 211.

As noted before, each of the support members 220 includes a hollow support bar 221 having the second fitting portion 221*a* at one end. To the support bar 221 is attached a support plate 222. The support bar 221 having this structure can support the support plate 222 properly while achieving weight reduction of the apparatus.

As described with reference to FIG. 4, the support plate 222 has a support surface 222*a* facing downward (the illumination side). The support plate 222 is on the lower side in the figure with respect to the support bar 221. This arrangement ensures that LED modules 300 can be placed on the support surface 222*a* without being hindered by the support bar 221.

As described with reference to FIG. 1, as viewed in plan, the periphery of each support member 220 has a first edge 251 that faces the first side 621 of periphery 620 of the cover 600, and a pair of second edges 252 that faces the second side 622 of the periphery 620 of the cover 600. When the four support members 220 are attached to the central member 210, the contour of the support members 220 as a whole has a generally rectangular shape corresponding to the shape of the periphery 620 of the cover 600 consisting of the first sides 621 and the second sides 622. This structure allows the LED modules 300 to be mounted on the support member 220 at a portion close to the periphery 620 of the cover 600, correspondingly to the shape of the periphery 620. This arrangement is suitable for preventing the periphery 620 of the cover 600 from becoming dark.

Since the LED lighting apparatus 101 is provided with the moisture absorber 740 containing the moisture absorbent 742, the LED modules 300 (LED chips 301) have enhanced durability. Since the moisture absorber 740 has the indicator 743 that can be seen from outside, the user can easily find that replacement of the moisture absorber 740 is necessary. Thus, the moisture absorbing function by the moisture absorber 740 is properly maintained. The replacement of the moisture absorber 740 can be easily performed by detaching the center portion 630 of the cover 600.

In this embodiment, the almost entire periphery of the support unit 200 and the cover 600 is surrounded by the clips 660. Thus, the LED lighting apparatus 101 has high airtightness, and hence has a high moisture resistance.

The LED lighting apparatus according to the present invention is not limited to the above-described embodiment. The specific structure of each part of the LED lighting apparatus according to the present invention can be varied in design in many ways.

Figure 12:
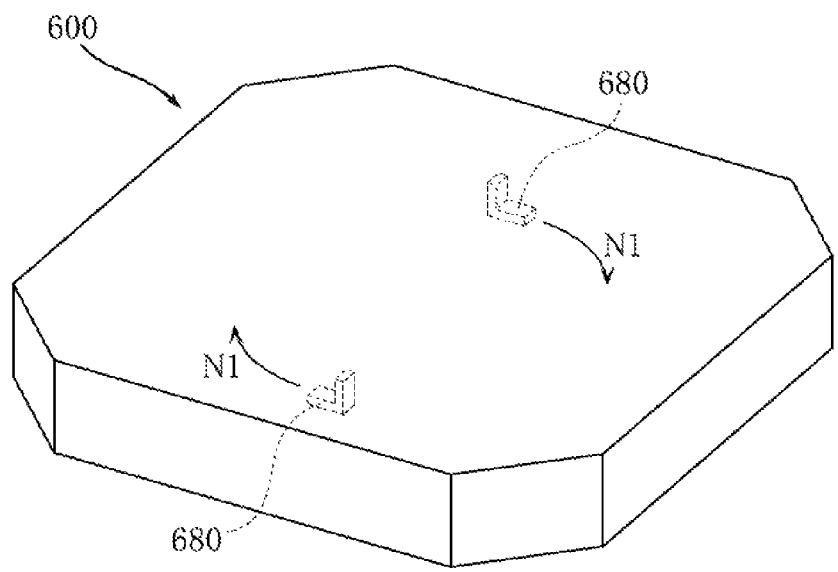
FIG. 12 is a schematic perspective view showing an example of the structure for attaching a cover to the support unit.
Figure 12:
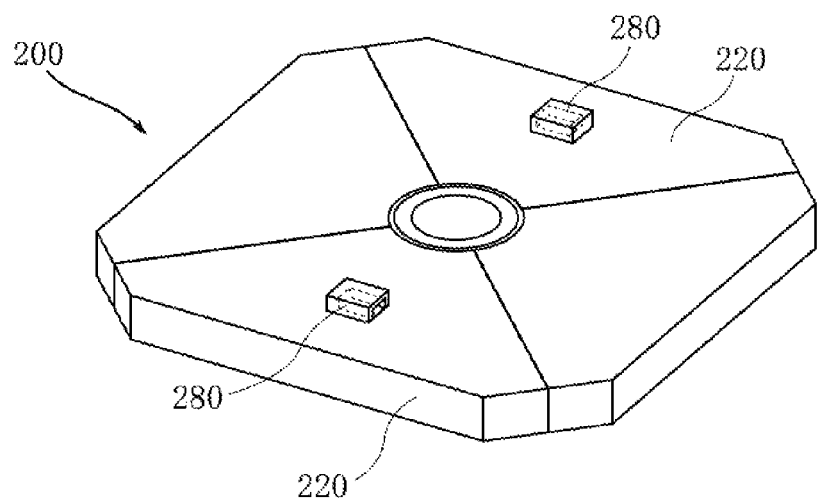

FIG. 12 shows another example of the structure for attaching the cover 600 to the support unit 200. This figure schematically shows the support unit 200 and the cover 600. The cover 600 has two engagement hooks 680. The support unit 200 (support member 220) has two case-like engagement portions 280 for receiving the engagement hooks 680, at positions corresponding to the engagement hooks 680. Between the outer edge of the support unit 200 and the inner peripheral surface of the cover 600 is defined a gap, which allows rotation of the cover 600 in the arrow N1 direction shown in FIG. 12. By this rotation, the engagement hooks 680 can be inserted into the engagement portions 280 after the cover 600 is placed over the support unit 200. This arrangement allows the cover 600 to be easily attached to the support unit 200, which is fixed to the ceiling 800 using e.g. an attachment.

Figure 13:
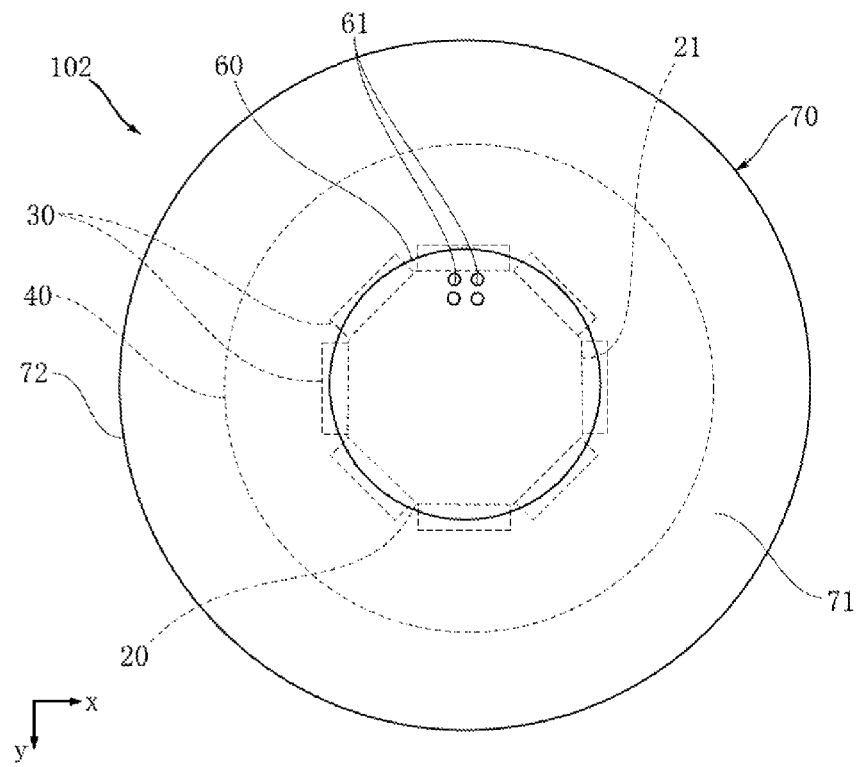
FIG. 13 is a plan view showing an LED lighting apparatus according to a second embodiment of the present invention.
Figure 14:
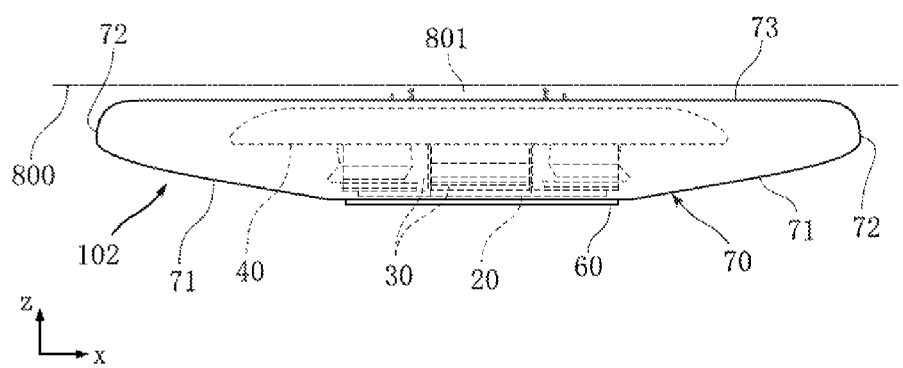
FIG. 14 is a side view showing the LED lighting apparatus of FIG. 13.
Figure 15:
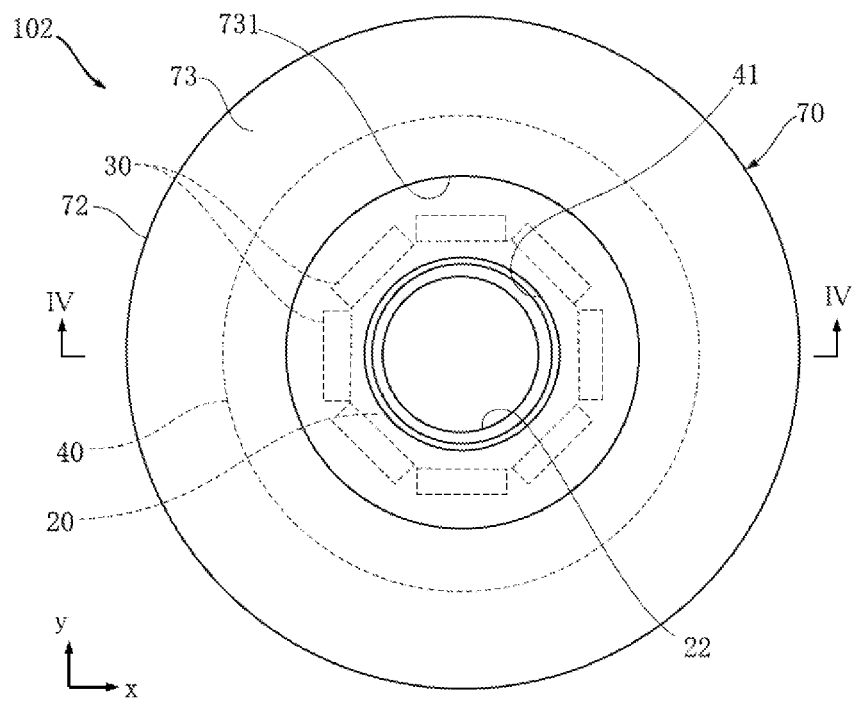
FIG. 15 is a bottom view showing the LED lighting apparatus of FIG. 13.
Figure 16:
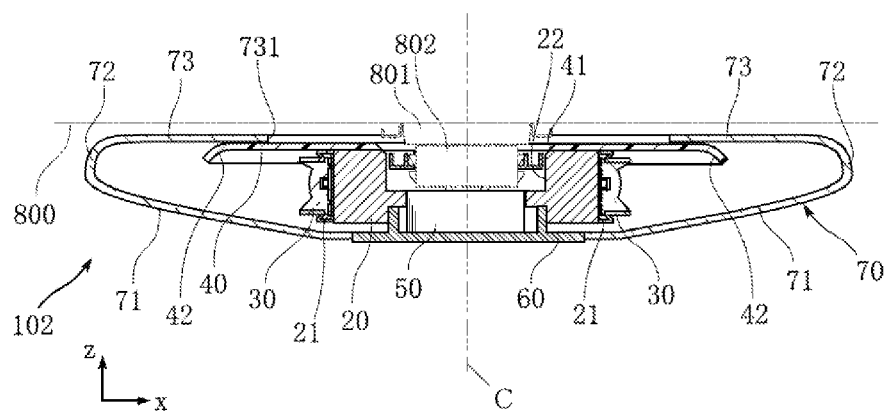
FIG. 16 is a sectional view taken along lines XVI-XVI in FIG. 15.

FIGS. 13-20 show an example of LED lighting apparatus according to a second embodiment of the present invention. The LED lighting apparatus 102 of this embodiment includes a support portion 20, a plurality of light source units 30, a diffusion reflection plate 40, a power source unit 50, a non-light-transmitting cover 60 and a light-transmitting cover 70. The LED lighting apparatus 102 is configured to be used as a ceiling light and attached to e.g. a power supply portion 801 in a ceiling 800 via an attachment 802. The direction z shown in FIG. 14 is the direction from the floor toward the ceiling 800 and corresponds to the first direction in the present invention. The lower side in the direction z in FIG. 14 is the illumination side, whereas the upper side in the direction z in the figure is the installation side. As shown in FIG. 13, the direction x and the direction y are perpendicular to each other and also perpendicular to the direction z. As shown in FIG. 13, the LED lighting apparatus 102 is circular as viewed in the direction z. The direction perpendicular to the direction z and extending along the diameter of the LED lighting apparatus 102 is defined as the radial direction. In the cross section shown in FIG. 16, the radial direction is along the direction x. In FIG. 16, on the left side, in the direction x, of the center line C indicated as a double-dashed line, "leftward" in the figure corresponds to "outward" in the radial direction. On the right side of the center line C in the direction x, "rightward" in the figure corresponds to "outward" in the radial direction.

The support portion 20 is made of e.g. metal and constitutes the support structure of the LED lighting apparatus 102. The support portion 20 is in the form of an equilateral octagon as viewed in the direction z and includes eight side surfaces 21 respectively extending along the eight sides of the octagon. The center of the support portion 20 corresponds to the center of the LED lighting apparatus 102. The eight side surfaces 21 partition between the outer side, which is one side in the radial direction, and the inner side, which is the other side in the radial direction. The inner side of the support portion 20 in the radial direction is surrounded by the eight side surfaces 21. Hereinafter, "inward" in the radial direction means the direction toward the center of the LED lighting apparatus 102, whereas "outward" in the radial direction means the direction away from the center of the LED lighting apparatus 102. Each side surface 21 is a surface parallel to the direction z. For instance, the two side surfaces 21 shown in FIG. 16 are perpendicular to the direction x. As shown in FIG. 16, a hollow portion 22, which is circular as viewed in the direction z, is provided at the center of the support portion 20. The hollow portion 22 is configured to receive the attachment 802 when the LED lighting apparatus 102 is attached to the ceiling 800. The power source unit 50 is arranged on the lower side of the hollow portion 22 in the direction z, as shown in FIG. 16.

The light source units 30 are supported on the support portion 20. As shown in FIG. 13, each of the light source units 30 is arranged on the outer side of a respective one of the side surfaces 21 in the radial direction.

Figure 17:
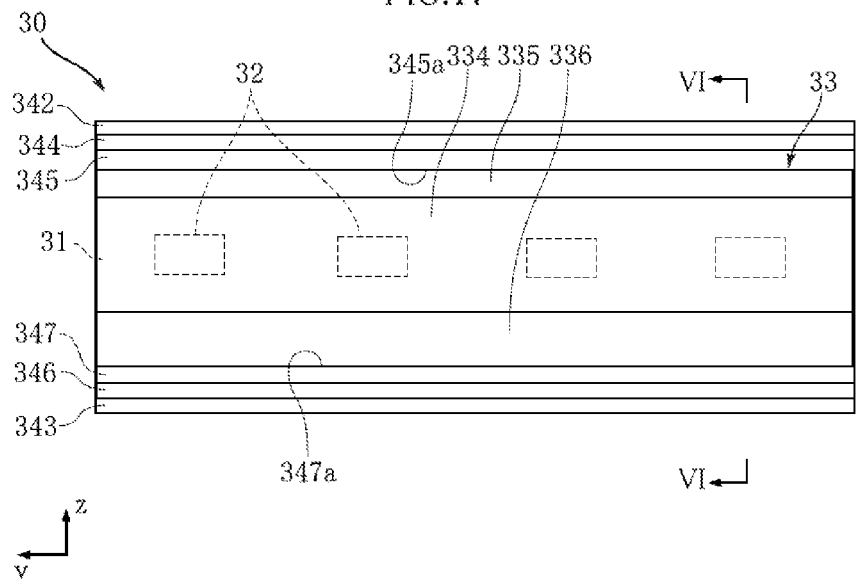
FIG. 17 shows the light source unit shown in FIG. 16.

FIGS. 17-20 show the details of each light source unit 30. The light source unit 30 shown in FIG. 17 is the left one of the light source units 30 in the cross section shown in FIG. 16. Other light source units 30 of this embodiment have the same structure as the light source unit 30 shown in FIGS. 17-20 and fixed to the support portion 20 in different orientations. Description is given below as to the light source unit 30 shown in FIGS. 17-20.

Figure 18:
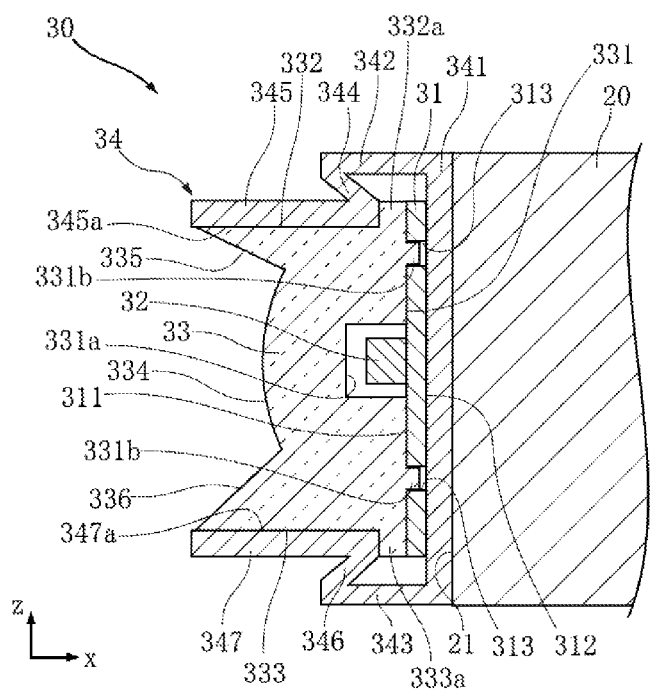
FIG. 18 is a sectional view taken along lines VI-VI in FIG. 17.
Figure 19:
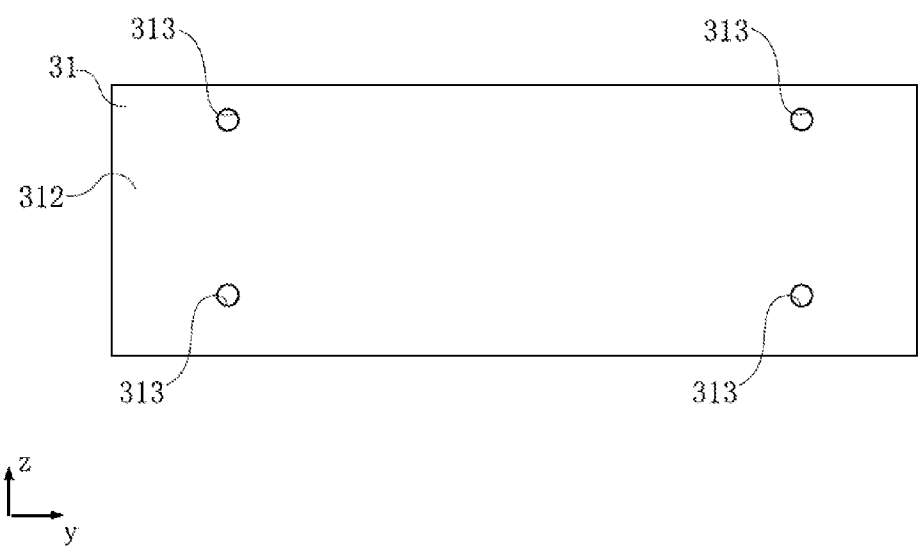
FIG. 19 shows the bottom surface of the substrate shown in FIG. 18.

The light source unit 30 includes a substrate 31, a plurality of LED modules 32, a protective member 33 and a holder 34. The substrate 31 is an insulating substrate made of e.g. glass-fiber-reinforced epoxy resin and includes a placing surface 311 and a bottom surface 312 facing opposite directions. As viewed in the direction x, the placing surface 311 and the bottom surface 312 are in the form of a rectangle elongated in the direction y. As shown in FIG. 19, the substrate 31 has two pairs of through-holes 313 spaced from each other in the longitudinal direction (the direction y in the figure). As shown in FIG. 18, each through-hole 313 penetrates the substrate 31 in the thickness direction (the direction x in the figure).

Figure 20:
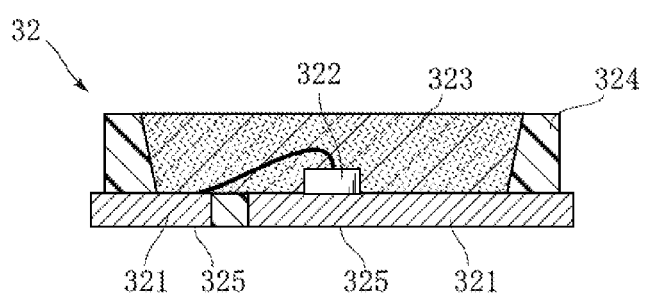
FIG. 20 shows the LED chip shown in FIG. 18.

As shown in FIG. 17, the LED modules 32 are aligned in the longitudinal direction of the substrate 31 (the direction y in the figure). As shown in FIG. 18, each LED module 32 is placed on the placing surface 311. Each of the LED modules 32 is in the form of an elongated rectangle as viewed in plan. FIG. 20 is a sectional view of the LED module 32 in a plane perpendicular to the width direction. As shown in the figure, the LED module 32 includes a pair of leads 321, an LED chip 322, a sealing resin 323 and a case 324. The paired leads 321 are made of e.g. Cu alloy. The LED chip 322 is mounted on one of the leads 321. The surfaces of the leads 321 opposite from the surface on which the LED chip 322 is mounted serve as mounting terminals 325 for surface-mounting the LED module 32. The LED chip 322 is the light source of the LED module 32 and is configured to emit e.g. blue light. The sealing resin 323 protects the LED chip 322. The sealing resin 323 is made of a light-transmitting resin material containing a fluorescent substance that emits yellow light when excited by light from the LED chip 322. According to this structure, the LED module 32 can be configured to emit light of a desired color temperature. Instead of the fluorescent substance that emits yellow light, mixture of a fluorescent substance that emits red light and a fluorescent substance that emits green light may be used. The case 324 is made of e.g. white resin and reflects the light traveling toward the sides from the LED chip 322 in the upward direction. An LED of a type that uses two wires for connection to the paired leads 321 may be employed as the LED chip 322.

The protective member 33 is made of a material that transmits light emitted from the LED module 32, and covers the LED module 32 for protection. The protective member 33 is made of e.g. an acrylic resin. As shown in FIG. 17, as viewed in the direction x, the protective member 33 is generally in the form of an elongated rectangle that overlaps the substrate 31. The protective member 33 has a uniform cross section and is elongated in the direction y. As shown in FIG. 18, the protective member 33 includes a bottom surface 331 in contact with the placing surface 311, a pair of side surfaces 332, 333 perpendicular to the bottom surface 331, a lens surface 334 opposite from the bottom surface 331, and a pair of tapered surfaces 335, 336.

As shown in FIG. 18, the protective member 33 has a recess 331a extending from the bottom surface 331 leftward in the figure. The LED module 32 is housed in the recess 331a. The protective member 33 further includes two pairs of projections 331b fitted in the paired through-holes 313. As shown in FIG. 18, each projection 331b projects from the bottom surface 331 rightward in FIG. 18. The projecting length of each projection 331b from the bottom surface 331 is smaller than the depth of each through-hole 313. Thus, the projection 331 does not penetrate the substrate 31 toward the bottom surface 312 side through the through-hole 313. By fitting the two pairs of projections 331b into the two pairs of through-holes 313, respectively, the protective member 33 is fixed to the substrate 31 so as not to deviate in the direction z.

As shown in FIG. 18, the side surfaces 332 and 333 are spaced from each other in the direction z. The protective member 33 further includes an engagement portion 332a projecting from the side surface 332 toward the installation side in the direction z, and an engagement portion 333a projecting from the side surface 333 toward the illumination side in the direction z. The engagement portions 332a, 333a project in the direction z from the right ends in FIG. 18 of the side surfaces 332, 333.

As shown in FIG. 18, the lens surface 334 is generally arcuate in cross section and overlaps the LED module 32 as viewed in the direction x. The lens surface 334 refracts the light emitted from the LED module 32 so that the light travels along the direction x.

The paired tapered surfaces 335 and 336 are arranged to sandwich the lens surface 334 in the direction z. The tapered surface 335 is a surface connecting the left edge in FIG. 18 of the side surface 332 and the upper edge in FIG. 18 of the lens surface 334 to each other, and inclined to be away from the LED module 32 in the direction z as proceeding away from the substrate 31 in the direction x. The tapered surface 336 is a surface connecting the left edge in FIG. 18 of the side surface 333 and the lower edge in FIG. 18 of the lens surface 334 to each other, and inclined to be away from the LED module 32 in the direction z as progressing away from the substrate 31 in the direction x.

The holder 34 is made of e.g. aluminum. As shown in FIG. 17, the holder 34 holds the protective member 33 in such a manner as to sandwich the protective member 33 in the direction z throughout the length in the direction y. As shown in FIG. 18, the holder 34 includes a bottom plate 341, and a pair of side plates 342 and 343 standing in the direction x from the upper and the lower edges of the bottom plate 341 in the direction z. The bottom plate 341 is sandwiched between the bottom surface 312 of the substrate 31 and the side surface 21 of the support portion 20 in the direction x and fastened to the side surface 21 using screws, for example. The paired side plates 342 and 343 face each other in the direction x, with the substrate 31 and the protective member 33 intervening between them. The holder 34 further includes a pair of support plates 345 and 347 positioned between the paired side plates 342 and 343 in the direction z, and leaf spring portions 344 and 346. The leaf spring portion 344 is connected to the left edge in FIG. 18 of the side plate 342. The leaf spring portion 346 is connected to the left edge in FIG. 18 of the side plate 343. The support plate 345 is connected to the side plate 342 via the leaf spring portion 344. The support plate 347 is connected to the side plate 343 via the leaf spring portion 346.

As shown in FIG. 18, the support plate 345 is in contact with the side surface 332 of the protective member 33. The contact surface 345a, which is the surface in contact with the side surface 332 of the support plate 345, is made a smooth mirror surface by polishing. Referring to FIG. 18, the right edge of the support plate 345 in the direction x is on the right side with respect to the left edge of the side plate 342 in the direction x. Referring to FIG. 18, the leaf spring portion 344 connects the right edge of the support plate 345 in the direction x and the left edge of the side plate 342 in the direction x to each other. When the leaf spring portion 344 is in a natural state, the support plate 345 is at a position lower than the position in the state shown in FIG. 18. The dimension of the leaf spring portion 344 in the direction z in the state shown in FIG. 18 is shorter than that in the natural state. In the state shown in FIG. 18, a downward force is applied to the support plate 345 so that the contact surface 345a presses the side surface 332 downward in the direction z. The right edge of the support plate 345 in the direction x is in contact with the engagement portion 332a. By the action of the leaf spring portion 344, the support plate 345 presses the engagement portion 332a rightward in the direction x.

As shown in FIG. 18, the support plate 347 is in contact with the side surface 333 of the protective member 33. The contact surface 347a, which is the surface in contact with the side surface 333 of the support plate 347, is made a smooth mirror surface by polishing. Referring to FIG. 18, the right edge of the support plate 347 in the direction x is on the right side with respect to the left edge of the side plate 343 in the direction x. Referring to FIG. 18, the leaf spring portion 346 connects the right edge of the support plate 347 in the direction x and the left edge of the side plate 343 in the direction x to each other. When the leaf spring 346 is in a natural state, the support plate 347 is at a position higher than the position in the state shown in FIG. 18. The dimension of the leaf spring portion 346 in the direction z in the state shown in FIG. 18 is shorter than that in the natural state. In the state shown in FIG. 18, an upward force is applied to the support plate 347 so that the contact surface 347a presses the side surface 333 upward in the direction z. The right edge of the support plate 347 in the direction x is in contact with the engagement portion 333a. By the action of the leaf spring portion 346, the support plate 347 presses the engagement portion 333a rightward in the direction x.

The diffusion reflection plate 40 is made of e.g. a white resin material that reflects light from the LED modules 32 and arranged on the installation side of the support portion 20 in the direction z. As shown in FIG. 13, the contour of the diffusion reflection plate 40 is circular as viewed in the direction z. The diameter of this circle is smaller than the diameter of the circle defining the contour of the LED lighting apparatus 102. As shown in FIG. 15, the diffusion reflection plate 40 has an opening 41 at the center. The opening 41 exposes the attachment 802 to the installation side. As shown in FIG. 16, the diffusion reflection plate 40 further includes an inclined portion 42 which is gradually displaced toward the illumination side in the direction z as proceeding radially outward. Specifically, as shown in FIG. 16, the inclined portion 42 displaces toward the illumination side in the direction z as proceeding away from the light source units 30 in the direction x. The inclined portion 42 is circular as viewed in the direction z and constitutes the outer peripheral portion of the diffusion reflection plate 40 in the radial direction. For instance, as shown in FIG. 16, the inclined portion 42 is provided to overlap the light source units 30 as viewed in the radial direction.

The power source unit 50 converts e.g. AC 100V power supplied through the power supply portion 801 in the ceiling 800 to DC power suitable for lighting the LED chips 322 and supplies the DC power to the LED modules 32. The power source unit 50 includes e.g. a transformer, a capacitor, a resistor, a diode and an IC. The power source unit 50 is configured to control each of the eight light source units 30 individually. The power source unit 50 is connected to a brightness sensor, not shown. The power source unit 50 is configured to turn off some of the LED modules 32, depending on the brightness of the room detected by the brightness sensor.

The non-light-transmitting cover 60 is provided on the illumination side of the support portion 20 in the direction z. The non-light-transmitting cover 60 is made of e.g. aluminum and circular as viewed in the direction z. As shown in FIG. 13, the non-light-transmitting cover 60 has openings 61 adjacent to the periphery. The above-described brightness sensor is attached to the non-light-transmitting cover 60 to face the openings 61. As shown in FIG. 16, the non-light-transmitting cover 60 is rotatably fitted to the lower end of the hollow portion 22 in the direction z. The position of the brightness sensor can be changed by rotating the non-light-transmitting cover 60 in the circumferential direction.

Alternatively, a plurality of openings may be provided at different positions along the periphery of the non-light-transmitting cover 60 and a connector may be attached to each of the openings such that the position of the brightness sensor can be changed. Alternatively, the brightness sensor and the power source unit 50 may be connected via a connection part comprising a wiring covered with resin so that the position of the brightness sensor can be set freely.

The light-transmitting cover 70 constitutes most of the appearance of the LED lighting apparatus 102. The light-transmitting cover 70 is made of e.g. milky-white translucent resin and includes an illumination-side covering portion 71, a peripheral portion 72 and an installation-side covering portion 73. As shown in FIG. 13, the illumination-side covering portion 71 has an annular shape surrounding the non-light-transmitting cover 60 as viewed in the direction z. As shown in FIG. 16, the peripheral portion 72 extends from the outer edge of the illumination-side covering portion 71 in the direction z. As shown in FIG. 15, the installation-side covering portion 73 is formed with an opening 731 at the center and has an annular shape as viewed in the direction z. The outer edge of the installation-side covering portion 73 is connected to the peripheral portion 72. The installation-side covering portion 73 is positioned on the installation side with respect to the diffusion reflection plate 40 in the direction z. As shown in FIG. 16, the outer edge of the diffusion reflection plate 40 in the radial direction (the direction x in the figure) is positioned inward in the radial direction (the direction x in the figure) with respect to the outer edge of the installation-side covering portion 73 in the radial direction (the direction x in the figure).

As shown in FIG. 16, the illumination-side covering portion 71 is inclined to be closer to the ceiling 800 in the direction z as proceeding away from the center in the radial direction. The lower edge of the illumination-side covering portion 71 in the direction z is arranged on the illumination side (lower side in the figure) of the support portion 20 in the direction z. The installation-side covering portion 73 is arranged on the installation side (upper side in the figure) of the support portion 20 and the diffusion reflection plate 40 in the direction z. The diameter of the opening 731 is smaller than the diameter of the diffusion reflection plate 90, and the diffusion reflection plate 40 is exposed through the opening 731. In other words, the LED lighting apparatus 102 includes, on the installation side, a portion that is not covered by the diffusion reflection plate 40 which is relatively small, and this portion is covered by the installation-side covering portion 73.

The advantages of the LED lighting apparatus 102 are described below.

In this embodiment, each of the light source units 30 is arranged to emit light outward in the radial direction. Each light source unit 30 has a lens surface 334 at a position overlapping the LED modules 32 as viewed in the radial direction, which is provided for causing light to travel along the radial direction. This ensures that a larger amount of light from the LED modules 32 travels along the radial direction. Part of the light traveling from the light source unit 30 along the radial direction is reflected by the inclined portion 42 toward the floor surface. This arrangement ensures high brightness at an area right under the LED lighting apparatus 102. Part of the light that travels from the light source unit 30 in the radial direction and that is not reflected by the inclined portion 42 reaches the light-transmitting cover 70. Since the light-transmitting cover 70 is made of milky-white translucent resin, the light-transmitting cover 70 diffuses part of the light, while transmitting remaining part of the light. The light passing through the light-transmitting cover 70 substantially horizontally illuminates an area distant from the LED lighting apparatus 102 in the radial direction.

Not all the light from the LED module 32 reach the lens surface 334. That is, part of the light from the LED module 32 travels through the protective member 33 to reach the contact surface 345a or the contact surface 347a. As noted before, each contact surface 395a, 347a is made a smooth mirror surface by polishing. Thus, the light is properly reflected by the contact surface 345a, 347a to travel through the protective member 33 again. The light reflected by the contact surface 345a is emitted toward the illumination side in the direction z through the tapered surface 335. The light reflected by the contact surface 347a is emitted toward the installation side in the direction z through the tapered surface 336.

The light emitted through the tapered surface 335 toward the illumination side in the direction z reaches the illumination-side covering portion 71. Part of the light emitted through the tapered surface 336 also reaches the illumination-side covering portion 71 after being reflected by the diffusion reflection plate 40. These light rays mostly serve to illuminate the illumination side in the direction z. However, part of these light rays is reflected by the illumination-side covering portion 71 toward the installation side in the direction z and impinges on the installation-side covering portion 73 without being reflected by the diffusion reflection plate 40. Also, part of the light emitted through the tapered surface 336 impinges on the installation-side covering portion 73 without impinging on the diffusion reflection plate 40. The light traveling through the installation-side covering portion 73 is emitted toward the installation side in the direction z to illuminate the ceiling 800. In this way, the LED lighting apparatus 102 allows part of the light from the light source units 30 to be emitted toward the installation side, while properly guiding most of the light toward the illumination side. Thus, the LED lighting apparatus 102 can illuminate the ceiling 800 brightly and prevents the phenomenon that the ceiling 800 looks dark, which occurs with the conventional LED Lighting apparatus.

As a method to fix the protective member 33 and the substrate 31 to the support portion 20, fastening to the support portion 20 using screws that penetrate the protective member 33 is conventionally known. With this method, however, the protective member 33 made of acrylic resin may be broken or deformed. In the light source unit 30 according to this embodiment, the protective member 33 made of acrylic resin is supported by applying pressure from above and below in the direction z in FIG. 18 by the paired support plates 345 and 347. This arrangement reduces the risk of damage to the protective member 33. Moreover, since the two pairs of projections 331b of the protective member 33 are fitted in the two pairs of through-holes 313 of the substrate 31, the protective member 33 is prevented from moving in the direction z.

As shown in FIG. 18, the right edges in the figure of the paired support plates 345 and 347 are in contact with the paired engagement portions 332a and 333a. Since a force to the right in the direction x in the figure is applied by the leaf spring portions 344, 346 to the support plates 345 and 347, a force to press the substrate 31 against the bottom plate 341 is applied to the engagement portions 332a and 333a. This is favorable to fix the protective member 33 and the substrate 31.

Figure 21:
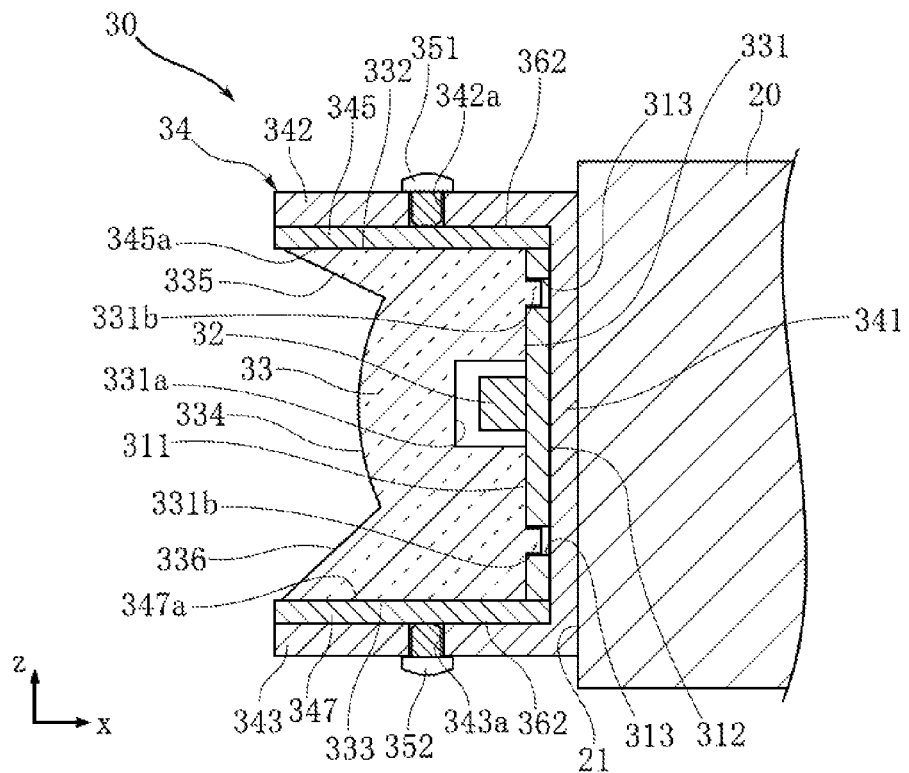
FIG. 21 is a sectional view showing another example of the light source unit of FIG. 16.
Figure 22:
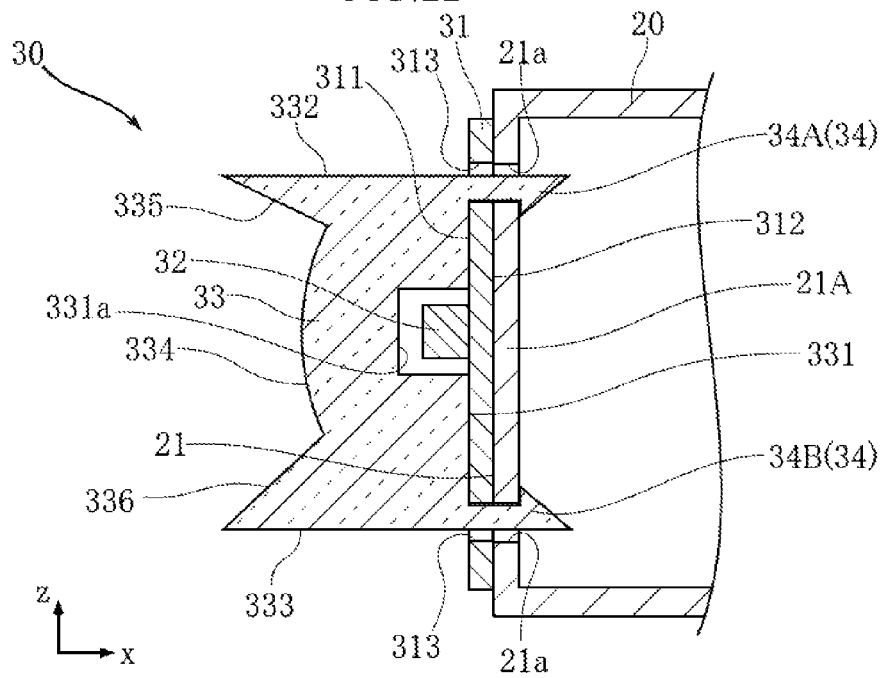
FIG. 22 is a sectional view showing another example of the light source unit of FIG. 16.

Other preferred embodiments of the light source units 30 are described below with reference to FIGS. 21 and 22. In FIGS. 21 and 22, the elements that are identical or similar to those of the light source units 30 of the foregoing embodiment shown in FIG. 18 are designated by the same reference signs as those used for the foregoing embodiment and the description is omitted appropriately.

In the light source unit 30 shown in FIG. 21, the paired support plates 345 and 347 are provided as separate parts from the paired side plates 342 and 343. The side plates 342 and 343 have holes 342a and 343a, respectively, which penetrate in the direction z. The inner circumferential surface of each hole 342a, 343a is threaded, and by fitting male screws 351 and 352 into the holes 342a and 343a, the support plates 345 and 347 sandwich and support the protective member 33 between them in the direction z. Unlike the protective member 33 shown in FIG. 18, the protective member 33 shown in FIG. 21 does not have engagement portions 332a, 333a. The right edge of each support plate 345, 347 in the direction x is in contact with the bottom plate 341. This arrangement also prevents damage to the protective member 33.

In the light source unit 30 shown in FIG. 22, the holder 34 is integral with the protective member 33. In this example shown in FIG. 22, the support portion 20 is made by combining relatively thin metal plates and includes a plate-like member 21A having a side surface 21 on the outer side in the direction x. The plate-like member 21A has two pairs of through-holes 21a open in the side surface 21. The two pairs of through-holes 21a are provided at positions corresponding to the two pairs of through-holes 313 as viewed in the direction x. The holder 34 in this embodiment comprises two pairs of projections provided correspondingly to the two pairs of through-holes 313. It is to be noted that only one pair 34A, 34B of the two pairs of projections are shown in FIG. 22. The projections 34A, 34B project from the upper edge and the lower edge, respectively, of the bottom surface 331 of the protective member 33 in the direction z to the right in the direction x in FIG. 22. The projections 34A, 34B extend through the through-holes 313 and the through-holes 21a to reach the inner side of the plate-like member 21A in the direction x. As shown in FIG. 22, the right end in the direction x in the figure of each of the paired projections 34A, 34B is wedge-shaped in cross section so that the protective member 33 does not easily come off the plate-like member 21A. With this fixing arrangement again, damage to the protective member is prevented.

FIGS. 23-34 show other embodiments of the present invention. In these figures, the elements that are identical or similar to those of the foregoing embodiment are designated by the same reference signs as those used for the foregoing embodiment.

Figure 23:
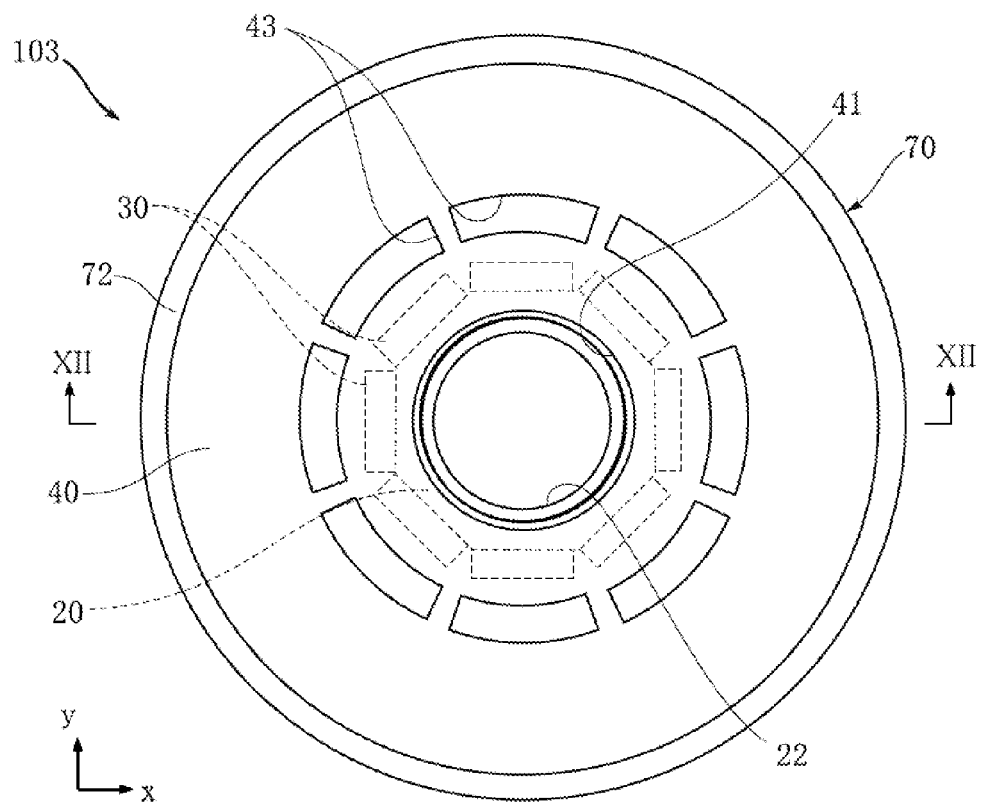
FIG. 23 is a bottom view showing an LED lighting apparatus according to a third embodiment of the present invention.
Figure 24:
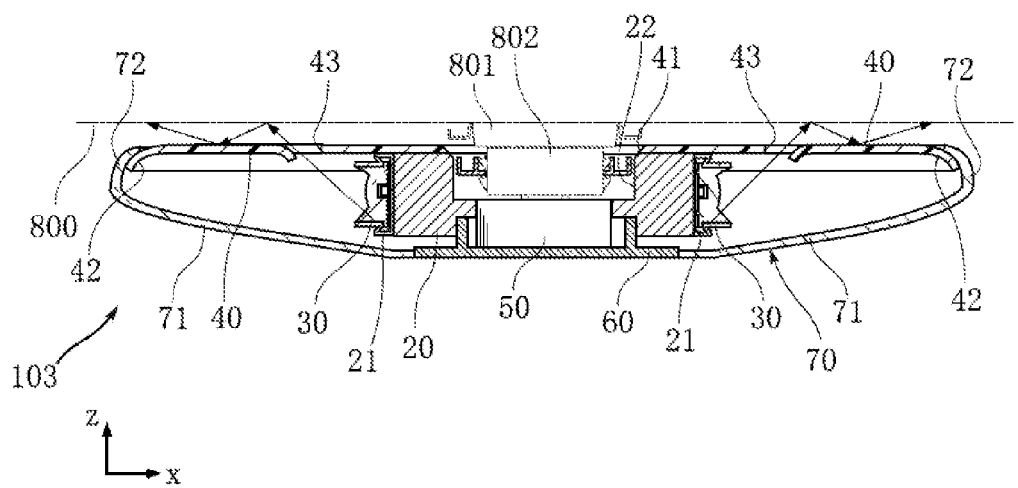
FIG. 24 is a sectional view taken along lines XXIV-XXIV in FIG. 23.

FIGS. 23 and 24 show an LED lighting apparatus according to a third embodiment of the present invention. The LED lighting apparatus 103 shown in FIGS. 23 and 24 are different from the LED lighting apparatus 102 in structure of the diffusion reflection plate 40 and the light-transmitting cover 70. The structures of other parts are the same as those of the LED lighting apparatus 102.

The diffusion reflection plate 40 of this embodiment has a plurality of windows 43 penetrating in the direction z. As shown in FIG. 24, the windows 43 are arranged along the circumference of a circle. Unlike the LED lighting apparatus 102, the light-transmitting cover 70 of this embodiment does not include the installation-side covering portion 73 and consists of the illumination-side covering portion 71 and the peripheral portion 72. In this embodiment, the region covered by the installation-side covering portion 73 in the LED lighting apparatus 102 is covered by the diffusion reflection plate 40. In this embodiment, the peripheral portion 72 is in contact with the inclined portion 42.

In this embodiment, part of the light from the light source units 30 is emitted to the installation side of the LED lighting apparatus 103 through the windows 43. With this LED lighting apparatus 103 again, the ceiling 800 is illuminated brightly.

Figure 25:
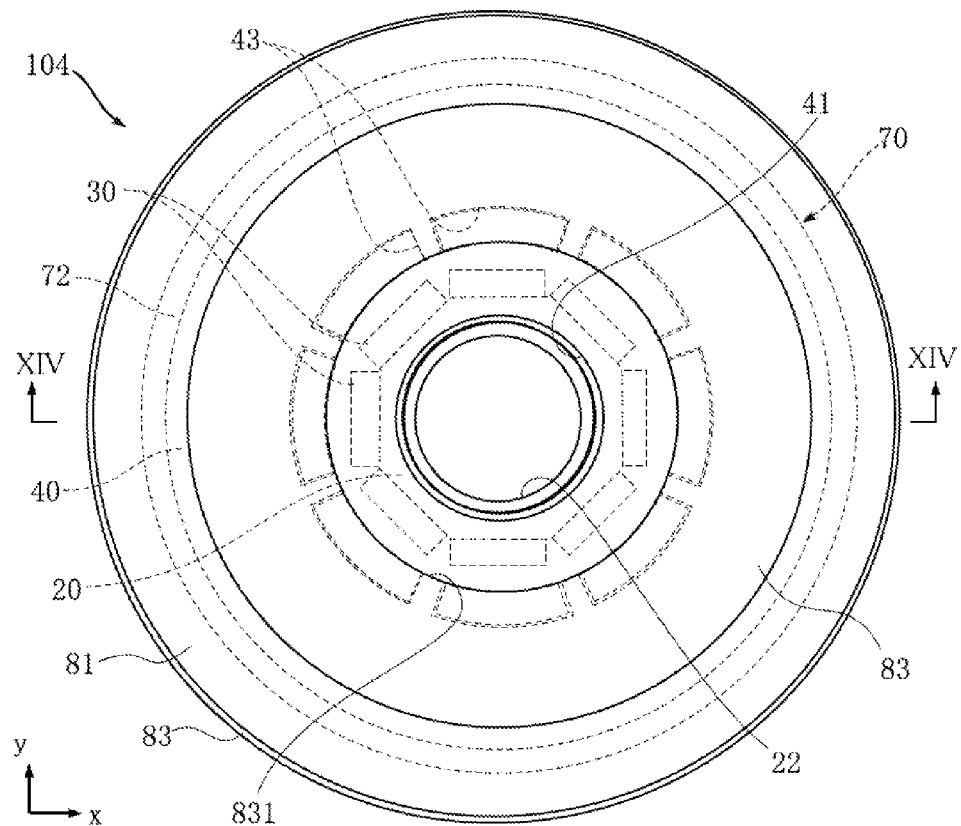
FIG. 25 is a bottom view showing an LED lighting apparatus according to a fourth embodiment of the present invention.
Figure 26:
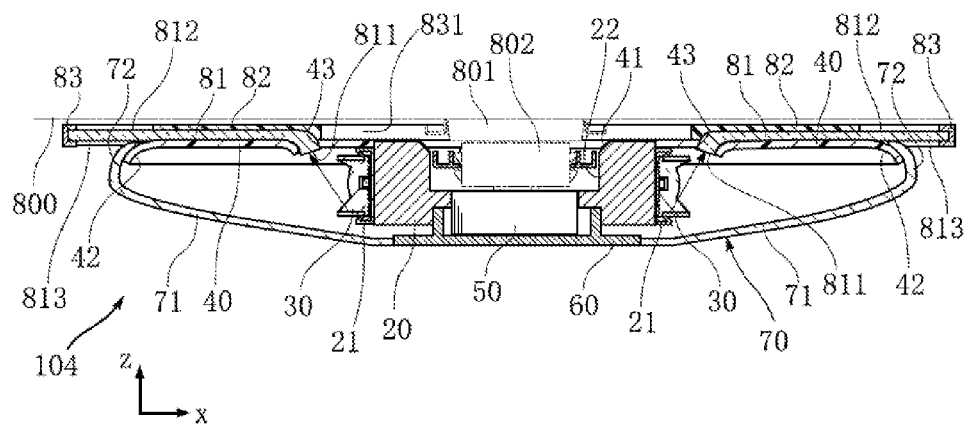
FIG. 26 is a sectional view taken along lines XXVI-XXVI in FIG. 25.
Figure 27:
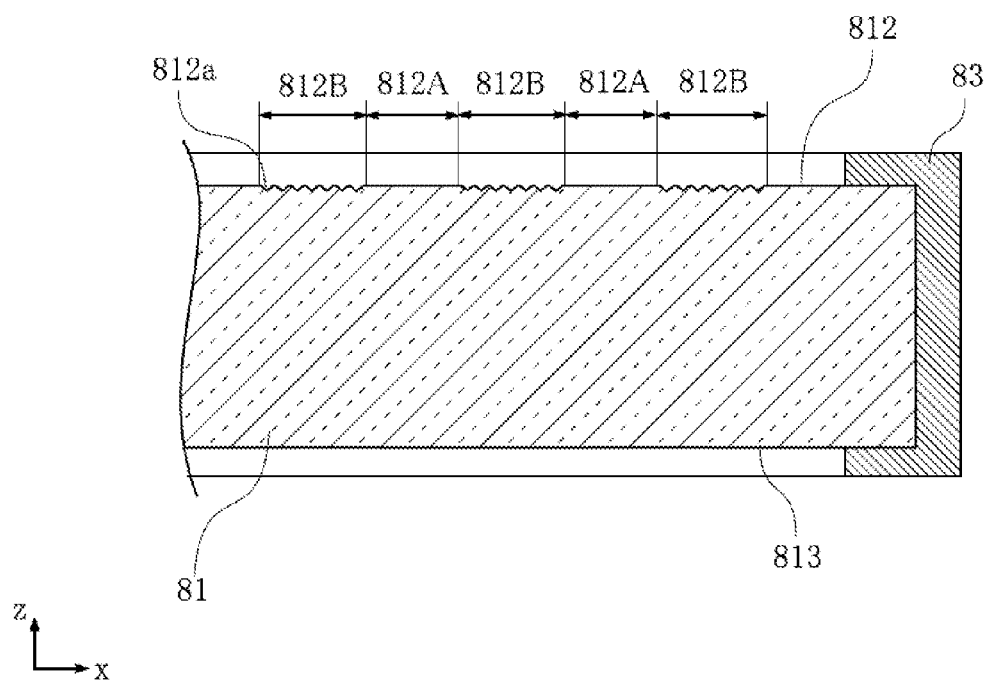
FIG. 27 is an enlarged view showing a principal portion of the light guide shown in FIG. 26.

FIGS. 25-27 show an LED lighting apparatus according to a fourth embodiment of the present invention. The LED lighting apparatus 104 shown in FIGS. 25-27 includes a light guide 81 provided on the installation side of the diffusion reflection plate 40 in the direction z, a reflector 82 covering part of the light guide 81 and a reflective part 83, in addition to the structural elements of the LED lighting apparatus 103.

The light guide 81 is made of e.g. transparent acrylic resin and in the form of an annular plate as viewed in the direction z. The light guide 81 is placed such that a surface of the light guide 81 on the illumination side in the direction z comes into contact with the diffusion reflection plate 40. As shown in FIG. 25, the circle defining the inner circumference of the light guide 81 is on the inner side of the windows 43 in the radial direction. The circle defining the outer circumference of the light guide 81 is on the outer side of peripheral portion 72 in the radial direction. As shown in FIG. 26, the light guide 81 includes an incident portion 811 facing the illumination side of the diffusion reflection plate 40 in the direction z through the windows 43, and emission surfaces 812 and 813. The reflector 82 is made of e.g. white resin and covers the installation side of the light guide 81 in the direction z as shown in FIG. 26. Specifically, the reflector 82 covers only the inner region of the light guide 81 in the radial direction, and the outer region of the light guide 81 in the radial direction is exposed from the reflector 82. Of the surface of the light guide 81 which faces the installation side in the direction z, the portion exposed from the reflector 82 constitutes the emission surface 812. Of the surface of the light guide 81 which faces the illumination side in the direction z, the portion which does not overlap the diffusion reflection plate 40 as viewed in the direction z constitutes the emission surface 813.

Part of the light emitted from the light source units 30 enters the light guide 81 through the incident portion 811 and travels outward in the radial direction while being repetitively reflected within the light guide 81. The inner region in the radial direction of the light guide 81 is sandwiched in the direction z between the reflector 82 and the diffusion reflection plate 40, so that light does not easily exit the light guide 81. The light traveling within the light guide 81 in the radial direction is emitted to the outside through the emission surface 812 or the emission surface 813. The light emitted through the emission surface 812 illuminates the ceiling 800. Thus, with the LED lighting apparatus 104 again, the ceiling 800 is illuminated brightly.

The reflective part 83 is made of e.g. metal and annular as viewed in the direction z. The reflective part 83 is formed to fit to the outer edge in the radial direction of the light guide 81. The inner surface in the radial direction of the reflective part 83 is made a mirror surface by polishing. The light reaching the outer edge of the light guide 81 after traveling within the light guide 81 is reflected inward by the mirror surface and emitted to the outside through the emission surface 812 or the emission surface 813. The reflective part 83 may be made of white resin.

FIG. 27 shows the portion adjacent to the outer edge of the light guide 81 in the direction x as enlarged. As shown in FIG. 27, the emission surface 812 has a plurality of smooth portions 812A, and rough portions 812B formed with irregularities. In the example shown in FIG. 27, the smooth portions 812A and the rough portions 812B are arranged alternately in the direction x. The dimension of each smooth portion 812A in the radial direction (the direction x in FIG. 27) is smaller than that of the rough portion 812B. For instance, the dimension of each smooth portion 812A in the radial direction is 0.2 mm, whereas the dimension of each rough portion 812B in the radial direction is 0.3 mm. The rough portion 812B may be formed by frosting. Part of the light impinging on the rough portions 812B is scattered to return into the light guide 81. The light scattered by the rough portions 812B travels in different directions so that a larger amount of light reaches an outer portion in the radial direction as compared with the structure in which entirety of the emission surface 812 comprises the smooth portion 812A.

Figure 28:
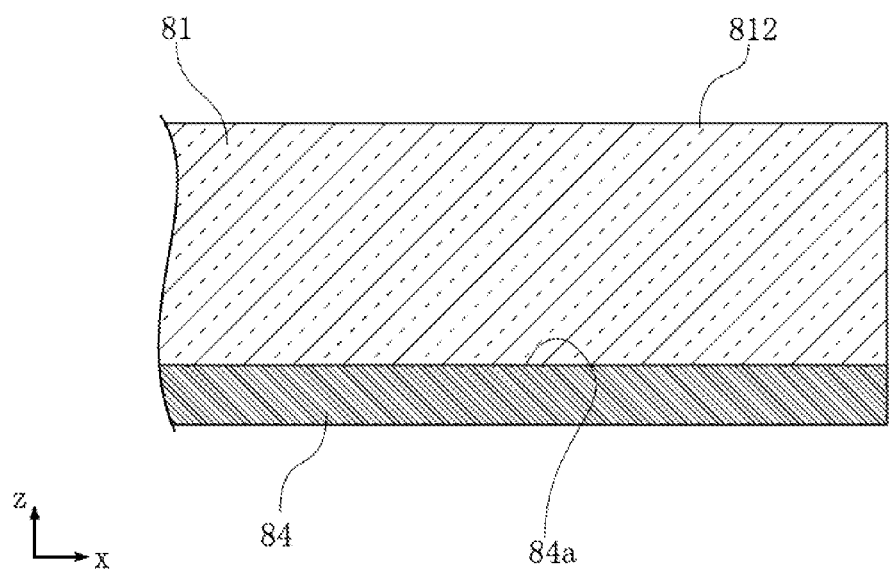
FIG. 28 is an enlarged view showing another example of the light guide of FIG. 27.
Figure 29:
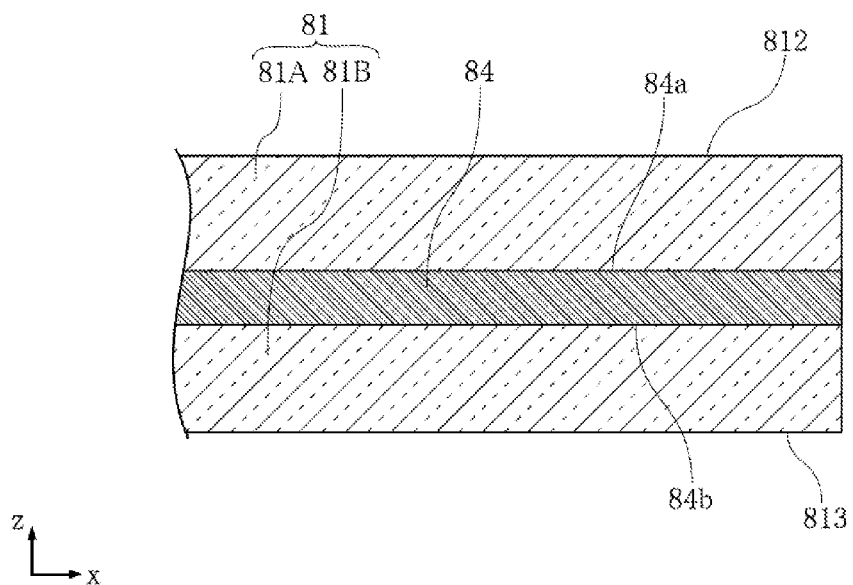
FIG. 29 is an enlarged view showing another example of the light guide of FIG. 28.
Figure 30:
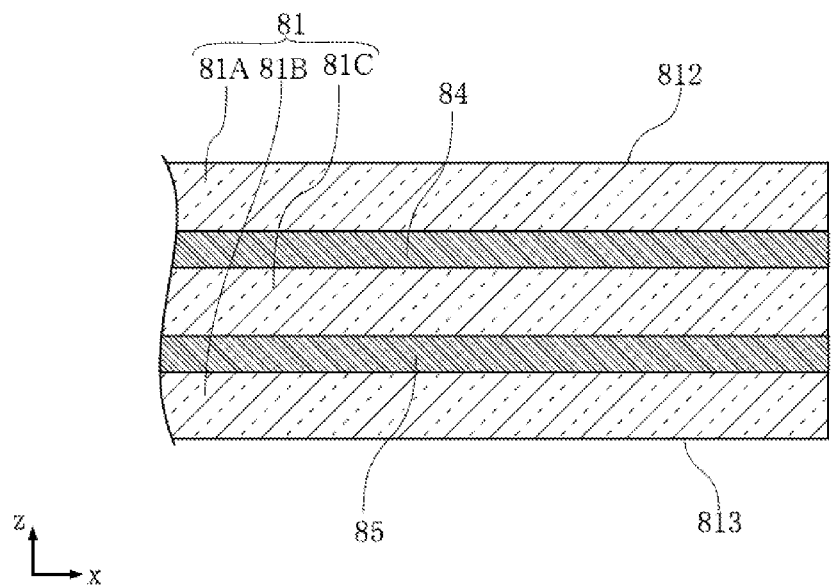
FIG. 30 is an enlarged view showing another example of the light guide of FIG. 28.

Shown in FIG. 27 is merely an example of the light guide 81. FIGS. 28-30 show other preferred examples of the light guide 81.

In the example shown in FIG. 28, a reflective member 84 having a reflective surface 84a facing the installation side is provided on the illumination side of the light guide 81 in the direction z. The entirety of the emission surface 812 comprises a smooth portion 812A. According to this example, the light reflected by the reflective surface 84a is emitted to the outside through the emission surface 812 so that the ceiling 800 is illuminated more brightly. The emission surface 812 may comprise a plurality of smooth portions 812A and a plurality of rough portions 812B, similarly to the example shown in FIG. 27.

In the example shown in FIG. 29, the light guide 81 comprises a light guide member 81A, and a light guide member 81B arranged on the illumination side in the direction z with respect to the light guide member 81A. As shown in FIG. 29, the light guide members 81A and 81B sandwich a reflective member 84 in the direction z. The reflective member 84 has a reflective surface 84a facing the installation side in the direction z and a reflective surface 84b facing the illumination side. The light guide member 81A has an emission surface 812 facing the installation side in the direction z, whereas the light guide member 81B has an emission surface 813 facing the illumination side in the direction z. This light guide 81 also ensures that the ceiling 800 is illuminated brightly.

In the example shown in FIG. 30, the light guide 81 comprises a light guide member 81A, a light guide member 81B arranged on the illumination side in the direction z with respect to the light guide member 81A, and a light guide member 81C sandwiched between the light guide members 81A and 81B in the direction z. As shown in FIG. 30, the light guide members 81A and 81C sandwich a reflective member 84 in the direction z, and the light guide member 81B and 81C sandwich a reflective member 85 in the direction z. This light guide 81 also ensures that the ceiling 800 is illuminated brightly. Since the reflective members 84 and 85 are arranged on and under the light guide member 81C in the direction z in FIG. 30, the light traveling through the light guide member 81C exits the light guide member 81C after reaching the outer end in the radial direction.

Figure 31:
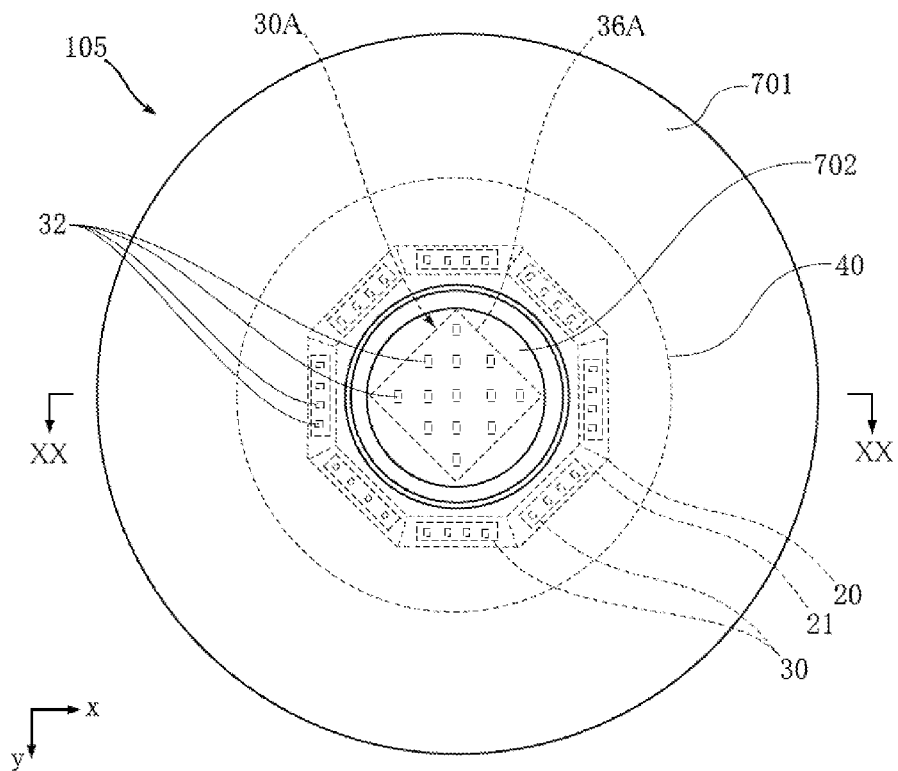
FIG. 31 is a plan view showing an LED lighting apparatus according to a fifth embodiment of the present invention.
Figure 32:
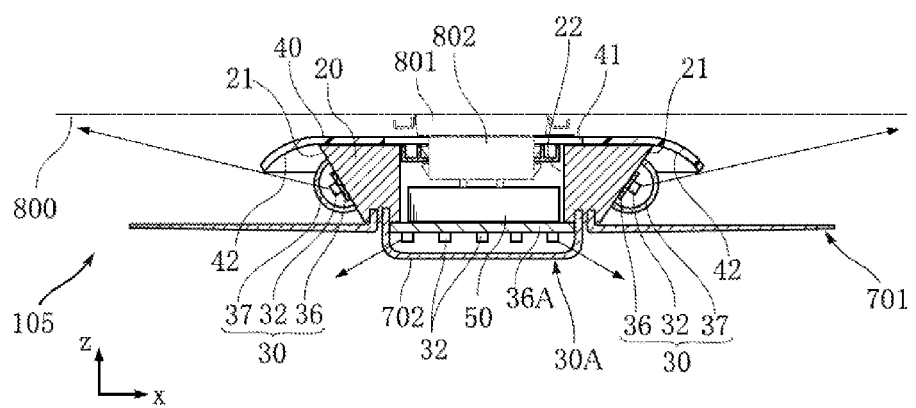
FIG. 32 is a sectional view taken along lines XXXII-XXXII in FIG. 31.

FIGS. 31 and 32 show an LED lighting apparatus according to a fifth embodiment of the present invention. The LED lighting apparatus 105 shown in FIGS. 31 and 32 is different from the LED lighting apparatus 102 in structure of the light source units 30 and that the side surfaces 21 are inclined. Further, the LED lighting apparatus 105 includes an additional light source unit 30A placed on the illumination side of the support portion 20 in the direction z, and light-transmitting covers 701 and 702 provided instead of the light-transmitting cover 70 and the non-light-transmitting cover 60.

In this embodiment, each side surface 21 is inclined with respect to a surface perpendicular to the radial direction so as to be gradually displaced outward in the radial direction as proceeding toward the installation side in the direction z.

Each light source unit 30 in this embodiment includes a substrate 36 having a placing surface and a bottom surface facing opposite directions, LED modules 32 and a protective member 37. The bottom surface of the substrate 36 is fixed to the side surface 21 of the support portion 20. For instance, a highly reflective white resist is applied in advance to the placing surface of the substrate 36. The LED modules 32 are placed on the placing surface of the substrate 36. The protective member 37 is made of e.g. transparent acrylic resin and covers the LED modules 32. The protective member 37 is e.g. in the form of a tube generally semicircular in cross section. The light source unit 30 having this structure is considerably simpler than the light source unit 30 of the LED lighting apparatus 102 and suitable for reducing the manufacturing cost.

The additional light source unit 30A includes a substrate 36A having a placing surface facing the illumination side in the direction z and a plurality of LED modules 32 placed on the placing surface of the substrate 36A. The light-transmitting cover 702 is circular as viewed in the direction z and covers the substrate 36A. As shown in FIG. 32, the end of the light-transmitting cover 702 on the illumination side in the direction z projects toward the illumination side in the direction z relative to the end of the light-transmitting cover 701 in the direction z. With this arrangement, part of the circumferential surface of the light-transmitting cover 702 in the radial direction is positioned on the illumination side in the direction z with respect to the light-transmitting cover 701, and light traveling outward in the direction z is emitted through this portion.

As shown in FIG. 31, the light-transmitting cover 701 has an annular shape surrounding the light-transmitting cover 702, as viewed in the direction z. As shown in FIG. 32, the light-transmitting cover 701 is in the form of a thin plate having a thickness in the direction z. The thickness of the light-transmitting cover 701 in the direction z reduces as proceeding outward in the radial direction. Specifically, the surface of the light-transmitting cover 701 on the installation side in the direction z is perpendicular to the direction z, and the surface on the illumination side is inclined to be displaced toward the installation side in the direction z as proceeding outward in the radial direction. With this arrangement, at an outer area in the radial direction to which light from the light source unit 30 does not easily reach, absorption and attenuation of light by the light-transmitting cover 701 is suppressed.

In this embodiment, the diameter of the circle defining the outer circumference of the light-transmitting cover 701 is more than twice the diameter of the circle defining the outer circumference of the diffusion reflection plate 40.

In this example, since the side surfaces 21 are inclined, a relatively large amount of light from the light source units 30 travels toward the illumination side. However, since the direction of the light from the light source units 30 is not corrected by using e.g. a lens, part of the light is emitted toward the installation side as well. Part of the light emitted toward the installation side travels through the outside of the diffusion reflection plate 40 in the radial direction to illuminate the ceiling 800.

Figure 33:
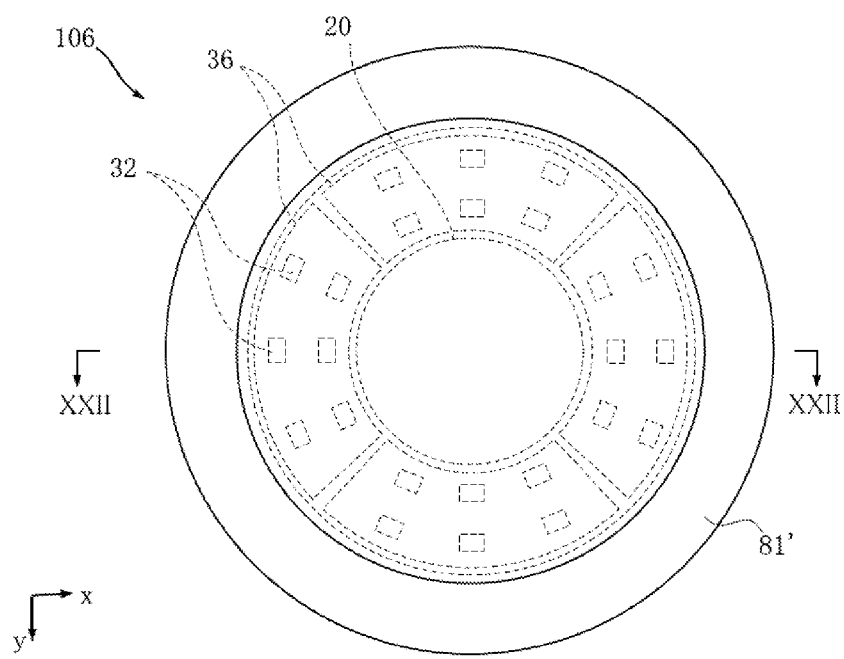
FIG. 33 is a plan view showing an LED lighting apparatus as a variation of the present invention.
Figure 34:
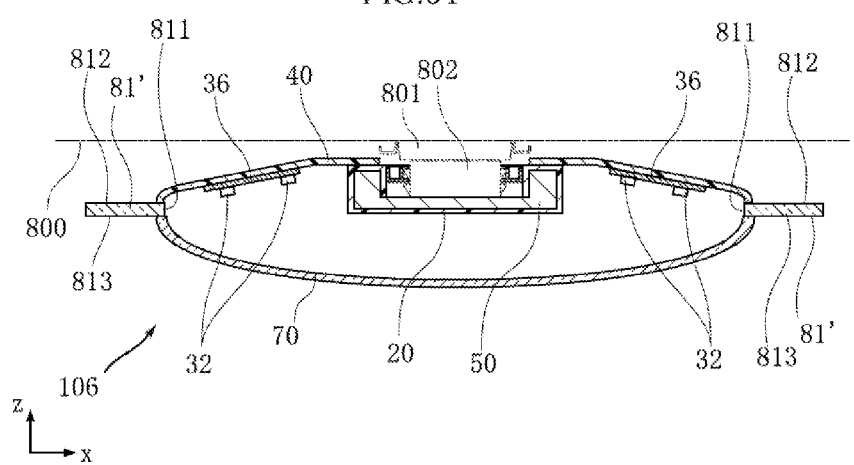
FIG. 34 is a sectional view taken along lines XXXIV-XXXIV in FIG. 33.
Figure 35:
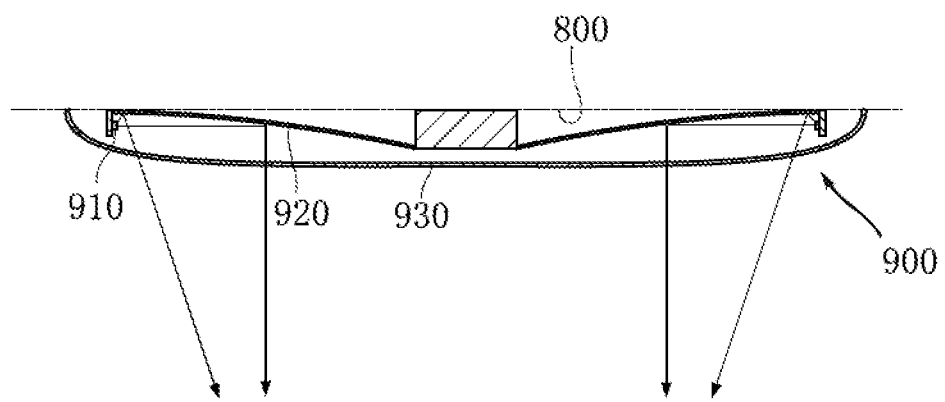
FIG. 35 is a sectional view showing a conventional LED lighting apparatus.
Figure 36:
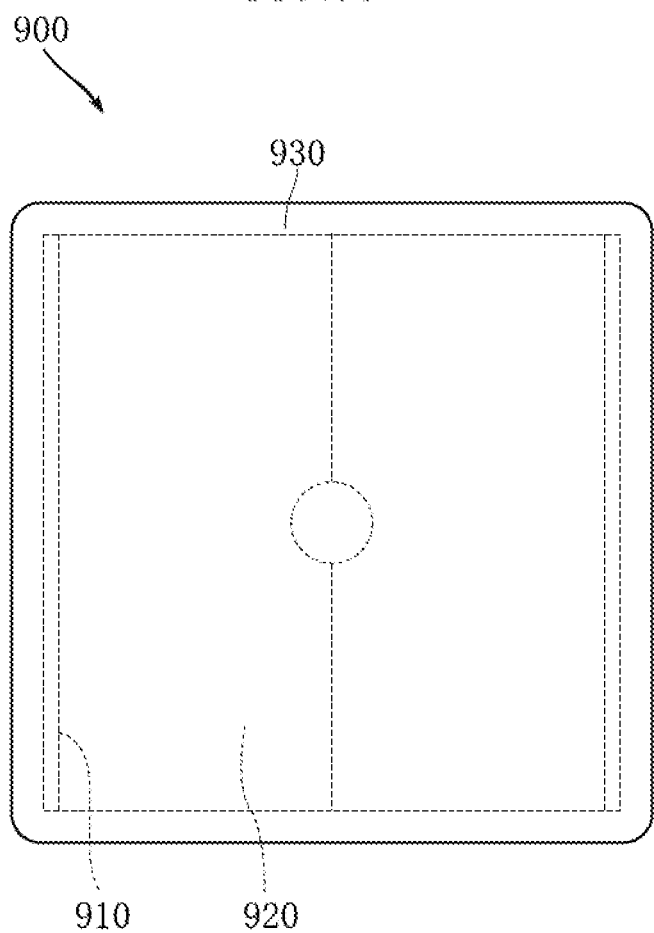
FIG. 36 is a plan view showing the conventional LED lighting apparatus.

FIGS. 33 and 34 show an LED lighting apparatus as a variation of the LED lighting apparatus according to the present invention. In the LED lighting apparatus 106 shown in FIGS. 33 and 34, substrates 36 are placed on the diffusion reflection plate 40. On the substrates 36 are placed the LED modules 32. The LED lighting apparatus 106 includes a light guide 81' that is annular as viewed in the direction z.

In the LED lighting apparatus 106, the circle defining the outer circumference of the diffusion reflection plate 40 and the circle defining the outer circumference of the light-transmitting cover 70 substantially overlap each other. The light guide 81' is provided substantially around the outer circumference of the diffusion reflection plate 40.

As shown in FIG. 34, the light guide 81' is sandwiched between the diffusion reflection plate 40 and the light-transmitting cover 70 and has an incident portion 811 at the inner edge in the radial direction. The light guide 81' has an emission surface 812 facing the installation side in the direction z and an emission surface 813 facing the illumination side. For instance, the light guide 81' is 8 to 10 mm in thickness in the direction z and 10 to 25 mm in width in the radial direction. The light guide 81' has a structure similar to the structure of the light guide 81 of the LED lighting apparatus 104 at a portion adjacent to the outer end in the radial direction.

The emission surface 812 of the light guide 81' may comprise smooth portions 812A and rough portions 812B that are alternately arranged, similarly to the emission surface shown in FIG. 27. The structures shown in FIGS. 28-30 are also applicable.

The LED lighting apparatus according to the present invention is not limited to the foregoing embodiments. The specific structure of each part of the LED lighting apparatus according to the present invention may be varied in design in many ways.

For instance, although the substrates 31 of the LED lighting apparatuses 102 and 103 are formed with through-holes 313 penetrating in the radial direction, the substrates need not necessarily have through-holes. Recesses extending inward in the radial direction may be provided instead of through-holes.

For instance, the placing surfaces 311 of the substrates 31 of the LED lighting apparatuses 102 and 103 may also be covered with white resist, similarly to the placing surface of the substrate 36 of the LED lighting apparatus 105.

Technical structures of the LED lighting apparatus provided according to the second aspect of the present invention are described below as appendixes.

APPENDIX 1

An LED lighting apparatus comprising:
a light source unit including at least one LED chip;
a support portion supporting the light source unit;
a light-transmitting cover at least part of which is on an illumination side, which is one side in a first direction, of the support portion, the light-transmitting cover being configured to transmit light from the light source unit; and
a diffusion reflection plate arranged on an installation side, which is the other side in the first direction, of the support portion, the diffusion reflection plate being configured to reflect light from the light source unit, wherein:
the support portion includes a plurality of side surfaces partitioning between an outer side, which is one side in a second direction perpendicular to the first direction, and an inner side, which is the other side in the second direction;
the inner side in the second direction is surrounded by the plurality of side surfaces; and
the light source unit is arranged on the outer side in the second direction of a first side surface that is one of the plurality of side surfaces.

APPENDIX 2

The LED lighting apparatus as set forth in Appendix 1, wherein the first side surface is perpendicular to the second direction.

APPENDIX 3

The LED lighting apparatus as set forth in Appendix 2, wherein the light source unit comprises:
a substrate including a placing surface and a bottom surface facing opposite directions;
a protective member configured to transmit light from the LED chip and covering the LED chip; and
a holder for fixing the substrate and the protective member to the first side surface;
the LED chip being placed on a placing surface side of the substrate.

APPENDIX 4

The LED lighting apparatus as set forth in Appendix 3, wherein the protective member includes a lens surface overlapping the LED chip as viewed in the second direction.

APPENDIX 5

The LED lighting apparatus as set forth in Appendix 4, wherein:

the protective member includes a pair of tapered surfaces arranged to sandwich the lens surface in the first direction; and each of the tapered surfaces is inclined to be away from the LED chip in the second direction as proceeding away from lens surface in the first direction.

APPENDIX 6

The LED lighting apparatus as set forth in anyone of Appendixes 3 through 5, wherein:

the holder includes a bottom plate sandwiched between the bottom surface and the first side surface in the second direction, and a pair of side plates standing from the bottom plate in the second direction; and the protective member is positioned between the paired side plates in the first direction.

APPENDIX 7

The LED lighting apparatus as set forth in Appendix 6, wherein:

the holder further includes a pair of support plates positioned between the paired side plates in the first direction; and the paired support plates sandwich and support the protective member in the first direction.

APPENDIX 8

The LED lighting apparatus as set forth in Appendix 7, wherein:

the protective member comprises:
a pair of side surfaces spaced apart from each other in the first direction;
a first engagement portion projecting from one of the side surfaces that is on the installation side in the first direction toward the installation side in the first direction; and
a second engagement portion projecting from the other one of the side surfaces that is on the illumination side in the first direction toward the illumination side in the first direction; and
one of the paired support plates that is on the installation side in the first direction is in contact with the first engagement portion, whereas the other one of the support plates that is on the illumination side in the first direction is in contact with the second engagement portion.

APPENDIX 9

The LED lighting apparatus as set forth in Appendix 7 or 8, wherein one of the paired support plates that is on the installation side in the first direction includes a mirror surface facing the illumination side in the first direction, whereas the other one of the support plates that is on the illumination side in the first direction includes a mirror surface facing the installation side in the first direction.

APPENDIX 10

The LED lighting apparatus as set forth in any one of Appendixes 7 through 9, wherein:

the substrate includes a through-hole penetrating in the second direction; and the protective member includes a projection fitted in the through-hole.

APPENDIX 11

The LED lighting apparatus as set forth in Appendix 5, wherein:

the substrate includes a through-hole penetrating in the second direction;

the first side surface includes an opening overlapping the through-hole as viewed in the second direction;

the protective member includes a bottom surface that is in contact with the placing surface; and the holder projects from the bottom surface of the protective member in the second direction to reach the opening through the through-hole.

APPENDIX 12

The LED lighting apparatus as set forth in anyone of Appendixes 1 through 11, wherein:

the diffusion reflection plate includes an inclined portion gradually displaced toward the illumination side in the first direction as proceeding away from the light source unit in the second direction; and the inclined portion overlaps the light source unit as viewed in the second direction.

APPENDIX 13

The LED lighting apparatus as set forth in anyone of Appendixes 1 through 12, wherein the light-transmitting cover includes an illumination-side covering portion, and an installation-side covering portion positioned on the installation side in the first direction with respect to the illumination-side covering portion.

APPENDIX 14

The LED lighting apparatus as set forth in Appendix 13, wherein the installation-side covering portion is on the installation side in the first direction with respect to the diffusion reflection plate.

APPENDIX 15

The LED lighting apparatus as set forth in Appendix 14, wherein an end of the diffusion reflection plate on the one side in the second direction is positioned on the other side in the second direction with respect to an end of the installation-side covering portion on the one side in the second direction.

APPENDIX 16

The LED lighting apparatus as set forth in any one of Appendixes 1 through 12, wherein the diffusion reflection plate includes a window penetrating in the first direction.

APPENDIX 17

The LED lighting apparatus as set forth in Appendix 16, further comprising a light guide arranged on the installation side in the first direction with respect to the diffusion reflection plate, the light guide including an incident portion facing the illumination side of the diffusion reflection plate in the first direction through the window, and an emission surface facing the installation side.

APPENDIX 18

The LED lighting apparatus as set forth in Appendix 17, wherein the emission surface includes a smooth portion, and a rough portion formed with irregularities.

APPENDIX 19

The LED lighting apparatus as set forth in Appendix 18, wherein the smooth portion is smaller than the rough portion in width in the second direction.

APPENDIX 20

The LED lighting apparatus as set forth in Appendix 19, further comprising a reflective member including a reflective surface facing the installation side, the reflective member being arranged on the illumination side of the light guide in the first direction.

APPENDIX 21

The LED lighting apparatus as set forth in Appendix 20, further comprising an additional light guide arranged on the illumination side of the reflective member in the first direction and including an additional emission surface facing the illumination side.

APPENDIX 22

The LED lighting apparatus as set forth in any one of Appendixes 17 through 21, further comprising a reflective part covering an edge of the light guide on the one side in the second direction.

APPENDIX 23

The LED lighting apparatus as set forth in Appendix 1, wherein the first side surface is inclined with respect to a surface perpendicular to the second direction and gradually displaced toward the one side in the second direction as proceeding toward the installation side in the first direction.

APPENDIX 24

The LED lighting apparatus as set forth in Appendix 23, wherein:
the light source unit includes a substrate including a placing surface and a bottom surface facing opposite directions;
the bottom surface is in contact with the first side surface; and
the LED chip is placed on a placing surface side of the substrate.

The invention claimed is:
1. An LED lighting apparatus comprising:
a support unit including a support surface facing an illumination side in a first direction;
a plurality of LED chips supported on the support surface; and
a cover that covers the support surface and transmits light from the LED chips;
wherein the cover has a periphery including four first sides spaced apart from each other and four second sides,
the first sides are grouped into a first pair and a second pair, each of the pairs including two parallel sides of the first sides, the two parallel sides of the first pair extending in a direction perpendicular to another direction in which the two parallel sides of the second pair extend,
each of the second sides connects two adjacent sides of the first sides, and said each of the second sides and each of said two adjacent sides form an obtuse angle.

2. The LED lighting apparatus according to claim 1, wherein the cover is formed with at least one concave lens corresponding in position to one of the second sides.

3. The LED lighting apparatus according to claim 1, wherein the second sides are shorter than the first sides.

4. The LED lighting apparatus according to claim 1, wherein the support unit comprises: a central member including an annular portion; and a plurality of support members removably attached to an outer circumference of the annular portion, each of the support members providing the support surface of the support unit.

5. The LED lighting apparatus according to claim 4, wherein the central member includes a plurality of first fitting portions arranged at regular intervals along the outer circumference of the annular portion, and each of the support members includes a second fitting portion configured to be fitted to a respective one of the first fitting portions to be attached to the central member.

6. The LED lighting apparatus according to claim 5, wherein each of the first fitting portions is a male part projecting outward in a radial direction of the annular portion, and each of the second fitting portions is a female part configured to receive a respective one of the first fitting portions.

7. The LED lighting apparatus according to claim 6, wherein each of the first fitting portions is H-shaped as viewed in the radial direction of the annular portion.

8. The LED lighting apparatus according to claim 4, wherein the annular portion is H-shaped in a cross section perpendicular to a circumferential direction of the annular portion.

9. The LED lighting apparatus according to claim 6, wherein each of the support members includes: a hollow support bar extending in a radial direction of the annular portion; and a support plate fixed to the support bar and including a surface serving as the support surface, wherein the second fitting portion is provided at an end of the support bar.

10. The LED lighting apparatus according to claim 9, wherein the support plate is positioned on the illumination side in the first direction with respect to the support bar.

11. The LED lighting apparatus according to claim 4, wherein the plurality of support members as a whole defines a generally rectangular contour.

12. The LED lighting apparatus according to claim 11, wherein the support members are made up of four members having a same shape.

13. The LED lighting apparatus according to claim 12, wherein each of the support members has a periphery including a first edge, a pair of second edges and a pair of third edges, the second edges being connected to ends of the first edge respectively, the third edges being connected to the second edges respectively, the first edge facing one of the first sides of the cover, each of the second edges facing one of the second sides of the cover, each of the third edges facing one of the third edges of adjacent support member.

14. The LED lighting apparatus according to claim 1, further comprising a moisture absorber including a moisture absorbent.

15. The LED lighting apparatus according to claim 4, further comprising a moisture absorber including a moisture absorbent, wherein the moisture absorber overlaps the central member as viewed in the first direction.

16. The LED lighting apparatus according to claim 14, wherein the moisture absorber includes an indicator for indicating whether moisture content of the moisture absorbent has exceeded a predetermined level.

17. The LED lighting apparatus according to claim 16, wherein the indicator comprises a material that changes color by absorbing moisture.

18. The LED lighting apparatus according to claim 17, wherein the moisture absorber includes a window for allowing the indicator to be seen from outside.

19. The LED lighting apparatus according to claim 14, wherein the moisture absorber is provided on an inner side of the cover.

20. The LED lighting apparatus according to claim 1, further comprising a power source unit for supplying power for the LED chips, wherein the power source unit is provided on a side of the support surface opposite to the illumination side.

* * * * *